US012483223B2

(12) United States Patent
Liu et al.

(10) Patent No.: US 12,483,223 B2
(45) Date of Patent: Nov. 25, 2025

(54) RADIO FREQUENCY ACOUSTIC DEVICE WITH LATERALLY DISTRIBUTED REFLECTORS

(71) Applicant: SKYWORKS GLOBAL PTE. LTD., Singapore (SG)

(72) Inventors: Jiansong Liu, Fremont, CA (US); Kwang Jae Shin, Yongin (KR); Alexandre Augusto Shirakawa, Cardiff By The Sea, CA (US)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 848 days.

(21) Appl. No.: 17/804,874

(22) Filed: Jun. 1, 2022

(65) Prior Publication Data

US 2022/0393664 A1   Dec. 8, 2022

Related U.S. Application Data

(60) Provisional application No. 63/196,366, filed on Jun. 3, 2021.

(51) Int. Cl.
*H03H 9/17* (2006.01)
*H01Q 1/50* (2006.01)
(Continued)

(52) U.S. Cl.
CPC .............. *H03H 9/175* (2013.01); *H01Q 1/50* (2013.01); *H03H 9/205* (2013.01); *H03H 9/583* (2013.01); *H03H 9/706* (2013.01)

(58) Field of Classification Search
CPC ........ H03H 9/175; H03H 9/205; H03H 9/583; H03H 9/706; H03H 9/02118; H03H 9/131;
(Continued)

(56) References Cited

U.S. PATENT DOCUMENTS 7,358,831 B2   4/2008   Larson, III et al.
9,385,303 B2   7/2016   Song et al.
(Continued)

FOREIGN PATENT DOCUMENTS

CN   111786645 A   10/2020
JP   2002374144 A   12/2002
(Continued)

OTHER PUBLICATIONS

Li et al., "Use of double-raised-border structure for quality factor enhancement of type II piston mode FBAR", Microsystem Technologies, Berlin, Germany, vol. 24, No. 7, May 2018, pp. 2991-2997.

(Continued)

*Primary Examiner* — Emily P Pham
(74) *Attorney, Agent, or Firm* — Lando & Anastasi, LLP

(57) ABSTRACT

A bulk acoustic wave resonator comprises a piezoelectric material layer, a first metal layer disposed on the upper surface of the piezoelectric material layer, a second metal layer disposed on the lower surface of the piezoelectric material layer, and a laterally distributed raised frame including a first raised frame disposed on the upper surface of the first metal layer and having an inner raised frame section with a tapered portion and a non-tapered portion and an outer raised frame section, and a second raised frame disposed beneath the first metal layer and the outer raised frame section, but not beneath the inner raised frame section, the inner raised frame section being laterally disposed from a central active region of the bulk acoustic wave resonator by a first distance, the outer raised frame section being laterally disposed from the central active region by a second distance greater than the first distance.

30 Claims, 19 Drawing Sheets

(51) Int. Cl.
*H03H 9/205* (2006.01)
*H03H 9/58* (2006.01)
*H03H 9/70* (2006.01)

(58) Field of Classification Search
CPC .. H03H 9/02157; H03H 9/171; H03H 9/0211; H03H 9/0514; H03H 9/54; H03H 9/02007; H03H 9/02015; H03H 9/1007; H10N 30/80; H01Q 1/50
See application file for complete search history.

(56) References Cited

U.S. PATENT DOCUMENTS

| | | | |
|---|---|---|---|
| 9,401,692 B2 | 7/2016 | Burak et al. |
| 9,425,764 B2 | 8/2016 | Burak et al. |
| 9,444,426 B2 | 9/2016 | Burak et al. |
| 9,484,882 B2 | 11/2016 | Burak et al. |
| 9,490,771 B2 | 11/2016 | Burak et al. |
| 9,853,626 B2 | 12/2017 | Burak et al. |
| 10,284,173 B2 | 5/2019 | Burak et al. |
| 10,367,472 B2 | 7/2019 | Burak et al. |
| 10,404,231 B2 | 9/2019 | Burak et al. |
| 10,608,611 B2 | 3/2020 | Tajic et al. |
| 10,756,702 B2 | 8/2020 | Lee et al. |
| 10,812,037 B2 | 10/2020 | Kyoung et al. |
| 11,050,409 B2 | 6/2021 | Park et al. |
| 11,082,023 B2 | 8/2021 | Shin et al. |
| 11,190,164 B2 | 11/2021 | Yen et al. |
| 11,482,985 B2 | 10/2022 | Fries et al. |
| 11,502,667 B2 | 11/2022 | Tajic et al. |
| 11,601,113 B2 | 3/2023 | Wang et al. |
| 2007/0057599 A1 | 3/2007 | Motai et al. |
| 2008/0024042 A1 | 1/2008 | Isobe et al. |
| 2008/0174389 A1 | 7/2008 | Mori et al. |
| 2009/0001848 A1 | 1/2009 | Umeda et al. |
| 2010/0013573 A1 | 1/2010 | Umeda |
| 2011/0180391 A1 | 7/2011 | Larson, III et al. |
| 2011/0304412 A1 | 12/2011 | Zhang |
| 2012/0200195 A1 | 8/2012 | Yokoyama et al. |
| 2013/0033337 A1 | 2/2013 | Nishihara et al. |
| 2013/0063227 A1 | 3/2013 | Burak et al. |
| 2013/0106248 A1 | 5/2013 | Burak et al. |
| 2013/0140959 A1 | 6/2013 | Shin et al. |
| 2013/0193809 A1 | 8/2013 | Araki |
| 2014/0118091 A1 | 5/2014 | Burak et al. |
| 2014/0118092 A1 | 5/2014 | Burak et al. |
| 2014/0167566 A1 | 6/2014 | Kando |
| 2014/0203684 A1 | 7/2014 | Yamamoto et al. |
| 2014/0203686 A1 | 7/2014 | Song et al. |
| 2014/0292150 A1 | 10/2014 | Zou et al. |
| 2014/0339959 A1 | 11/2014 | Lee et al. |
| 2015/0214923 A1 | 7/2015 | Tsuzuki |
| 2016/0028371 A1 | 1/2016 | Nishihara et al. |
| 2016/0118957 A1 | 4/2016 | Burak et al. |
| 2016/0118958 A1 | 4/2016 | Burak et al. |
| 2016/0164487 A1 | 6/2016 | Shin et al. |
| 2017/0033769 A1 | 2/2017 | Yokoyama |
| 2017/0093374 A1 | 3/2017 | Yatsenko et al. |
| 2017/0214388 A1 | 7/2017 | Irieda et al. |
| 2017/0244387 A1 | 8/2017 | Matsuda et al. |
| 2017/0288121 A1 | 10/2017 | Burak et al. |
| 2017/0288122 A1 | 10/2017 | Zou et al. |
| 2017/0331457 A1 | 11/2017 | Satoh |
| 2018/0013401 A1 | 1/2018 | Lee et al. |
| 2018/0048287 A1 | 2/2018 | Lee et al. |
| 2018/0085787 A1 | 3/2018 | Burak et al. |
| 2018/0115302 A1 | 4/2018 | Yeh et al. |
| 2018/0219528 A1 | 8/2018 | Liu et al. |
| 2018/0254764 A1 | 9/2018 | Lee et al. |
| 2018/0278231 A1 | 9/2018 | Hurwitz |
| 2018/0309427 A1 | 10/2018 | Kim et al. |
| 2018/0351533 A1 | 12/2018 | Lee et al. |
| 2019/0036592 A1 | 1/2019 | Shealy et al. |
| 2019/0115901 A1 | 4/2019 | Takahashi et al. |
| 2019/0363692 A1 | 11/2019 | Nosaka |
| 2020/0021273 A1 | 1/2020 | Sung et al. |
| 2020/0083861 A1 | 3/2020 | Matsuo et al. |
| 2020/0099359 A1 | 3/2020 | Shin et al. |
| 2020/0119713 A1 | 4/2020 | Kim et al. |
| 2020/0168785 A1 | 5/2020 | Ikeuchi et al. |
| 2020/0204148 A1 | 6/2020 | Kim et al. |
| 2020/0350888 A1 | 11/2020 | Moulard |
| 2020/0366266 A1 | 11/2020 | Pollard et al. |
| 2020/0366271 A1 | 11/2020 | Kim et al. |
| 2020/0373901 A1 | 11/2020 | Liu et al. |
| 2020/0373911 A1 | 11/2020 | Wang et al. |
| 2021/0028765 A1 | 1/2021 | Wang et al. |
| 2021/0083643 A1 | 3/2021 | Liu et al. |
| 2022/0311419 A1* | 9/2022 | Komatsu ............... H03H 9/175 |
| 2022/0368312 A1 | 11/2022 | Wang et al. |
| 2023/0006642 A1 | 1/2023 | Liu et al. |
| 2023/0109382 A1 | 4/2023 | Liu et al. |
| 2023/0188115 A1 | 6/2023 | Hatano |
| 2023/0261637 A1 | 8/2023 | Matsuo et al. |
| 2023/0299744 A1 | 9/2023 | Zhang et al. |

FOREIGN PATENT DOCUMENTS

| | | |
|---|---|---|
| JP | 2007208845 A | 8/2007 |
| JP | 2007288645 A | 11/2007 |
| JP | 2014090414 A | 5/2014 |
| WO | 2006129532 A1 | 12/2006 |
| WO | 2007119556 A1 | 10/2007 |
| WO | 2008126473 A1 | 10/2008 |
| WO | 2019029912 A1 | 2/2019 |

OTHER PUBLICATIONS

Combined Search and Examination Report from corresponding United Kingdom Application No. 2208132.7 dated Nov. 30, 2022.

* cited by examiner

RADIO FREQUENCY ACOUSTIC DEVICE WITH LATERALLY DISTRIBUTED REFLECTORS

CROSS-REFERENCE TO RELATED APPLICATIONS

This application claims priority under 35 U.S.C. § 119(e) to U.S. Provisional Patent Application Ser. No. 63/196,366, titled "RADIO FREQUENCY ACOUSTIC DEVICE WITH LATERALLY DISTRIBUTED REFLECTORS," filed Jun. 3, 2021, the entire contents which of being incorporated herein in its entirety for all purposes.

BACKGROUND

Technical Field

The present disclosure generally relates to bulk acoustic wave resonators.

Description of the Related Art

A bulk acoustic wave resonator is a device having a piezoelectric material between two electrodes. When an electromagnetic signal is applied to one of the electrodes, an acoustic wave is generated in the piezoelectric material and propagates to the other electrode.

Depending on the thickness of the piezoelectric material, resonance of such an acoustic wave is established, and on the other electrode, an electromagnetic signal having a frequency corresponding to the resonant acoustic wave is generated. Thus, such a bulk acoustic wave resonator can be utilized to provide filtering functionality for an electromagnetic signal such as a radio-frequency (RF) signal.

In many applications, the piezoelectric material between the electrodes is relatively thin and implemented as a film. Thus, a bulk acoustic wave resonator is sometimes referred to as a thin-film bulk acoustic wave resonator (TFBAR) or as a film bulk acoustic wave resonator (FBAR).

SUMMARY

In accordance with an aspect disclosed herein there is provided a bulk acoustic wave resonator device. The bulk acoustic wave resonator comprises a piezoelectric material layer having an upper surface and a lower surface, a first metal layer having a lower surface disposed on the upper surface of the piezoelectric material layer and an upper surface, a second metal layer having an upper surface disposed on the lower surface of the piezoelectric material layer and a lower surface, and a laterally distributed raised frame including a first raised frame disposed on the upper surface of the first metal layer and having an inner raised frame section with a tapered portion and a non-tapered portion and an outer raised frame section, and a second raised frame disposed beneath the first metal layer and the outer raised frame section, but not beneath the inner raised frame section, the inner raised frame section of the first raised frame being laterally disposed from a central active region of the bulk acoustic wave resonator device by a first distance, the outer raised frame section of the first raised frame being laterally disposed from the central active region of the bulk acoustic wave resonator device by a second distance, the second distance being greater than the first distance, the laterally distributed raised frame configured to improve reflection of lateral mode waves and to reduce conversion of main mode waves into lateral mode waves.

In some embodiments, the first raised frame is formed of a metal.

In some embodiments, the second raised frame is formed of an oxide.

In some embodiments, the outer raised frame section of the first raised frame has a width and a substantially uniform thickness across the width.

In some embodiments, the second raised frame includes an inner tapered portion and an outer non-tapered portion.

In some embodiments, the inner tapered portion of the second raised frame has a taper angle of from 10° and 60°.

In some embodiments, the outer non-tapered portion of the second raised frame has a width and a substantially uniform thickness across the width.

In some embodiments, the tapered portion of the inner raised frame section of the first raised frame has a taper angle of from 5° to 45°.

In some embodiments, the bulk acoustic wave resonator device further comprises a dielectric layer disposed on the upper surface of the first metal layer and defining a recessed frame region surrounding the central active region.

In some embodiments, the bulk acoustic wave resonator device does not include a recessed frame region.

In some embodiments, the tapered portion of the inner raised frame section of the first raised frame has a width that is less than a width of the non-tapered portion of the inner raised frame section of the first raised frame.

In some embodiments, the tapered portion of the inner raised frame section of the first raised frame has a width that is greater than a width of the non-tapered portion of the inner raised frame section of the first raised frame.

In some embodiments, the second raised frame has an upper surface in contact with the lower surface of the first metal layer.

In some embodiments, the second raised frame has a lower surface in contact with the upper surface of the second metal layer.

In some embodiments, the second raised frame has an upper surface in contact with the piezoelectric material layer.

In some embodiments, the second raised frame has an upper surface in contact with the piezoelectric material layer.

In some embodiments, the second raised frame has a lower surface in contact with the piezoelectric material layer, the second raised frame dividing the piezoelectric material layer into an upper piezoelectric material layer and a lower piezoelectric material layer.

In some embodiments, the first raised frame is formed of a material with a higher acoustic impedance than a material of which the second raised frame is formed and a higher acoustic impedance than a material of which the piezoelectric material layer is formed.

In some embodiments, the second raised frame is formed of a material with a lower acoustic impedance than a material of which the first raised frame is formed and a lower acoustic impedance than a material of which the piezoelectric material layer is formed.

In some embodiments, the bulk acoustic wave resonator device is a film bulk acoustic wave resonator device including a cavity defined below the second metal layer.

In some embodiments, the bulk acoustic wave resonator device is a solidly mounted resonator including a Bragg reflector disposed beneath the second metal layer.

In some embodiments, the tapered portion of the inner raised frame section of the first raised frame has a linear taper.

In some embodiments, the tapered portion of the inner raised frame section of the first raised frame has a concave taper.

In some embodiments, the tapered portion of the inner raised frame section of the first raised frame has a convex taper.

In some embodiments, the second raised frame includes an inner tapered portion having a linear taper.

In some embodiments, the second raised frame includes an inner tapered portion having a concave taper.

In some embodiments, the second raised frame includes an inner tapered portion having a convex taper.

In some embodiments, a radio frequency filter includes a bulk acoustic wave resonator device as described above.

The radio frequency filter may be included in a radio frequency module.

The radio frequency module may be included in a radio frequency device.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
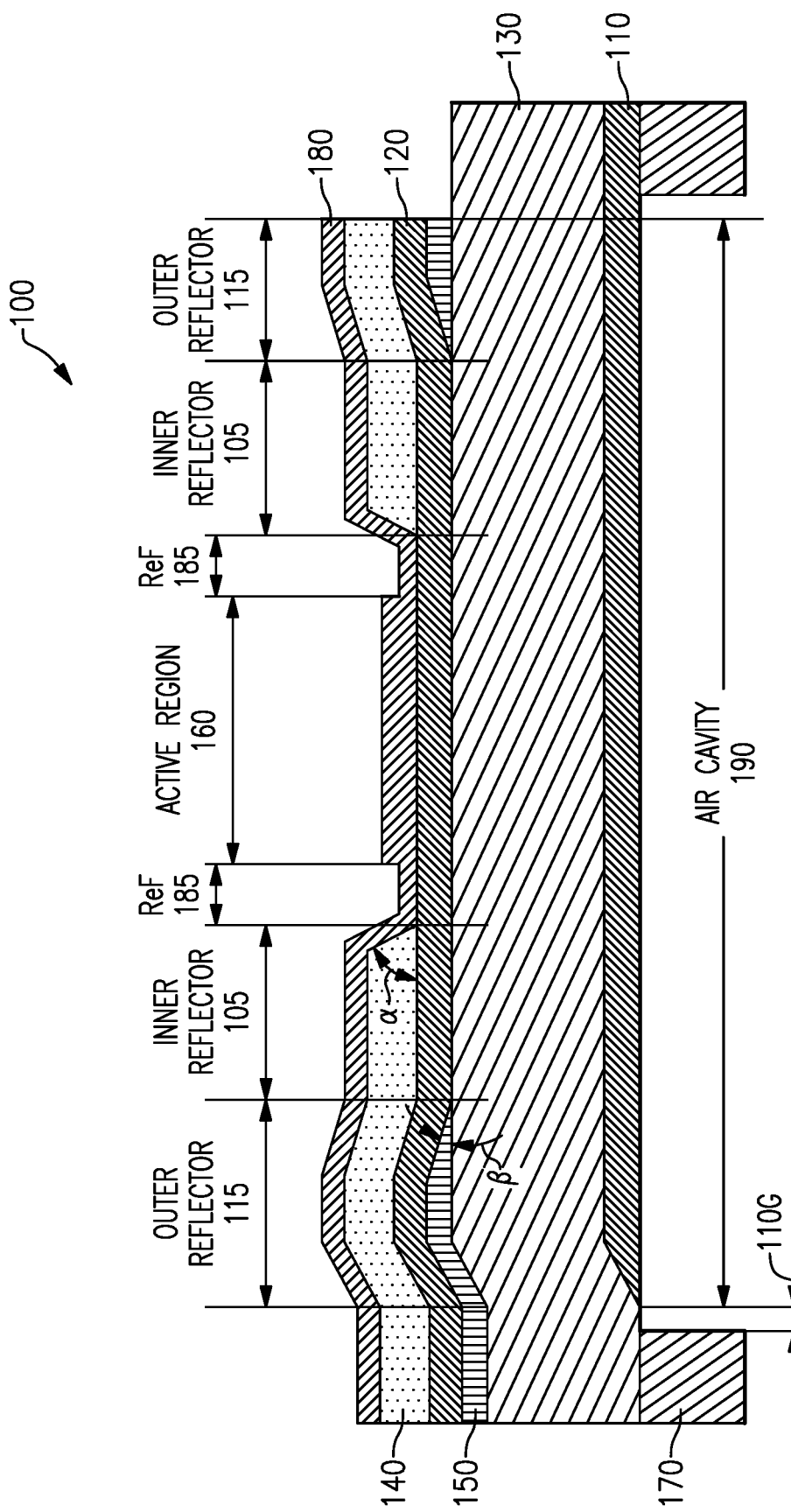
FIG. 1A is a cross-sectional view of an example of a FBAR device including one or more tapered raised frames.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The headings provided herein, if any, are for convenience only and do not necessarily affect the scope or meaning of the claimed invention.

Described herein are various examples related to film bulk acoustic wave resonators (FBARs) and related devices having an improved quality factor Q. For example, FBARs and related devices described herein can have increased mode reflection and reduced mode conversion. Although such examples are described in the context of FBARs, it will be understood that one or more features of the present disclosure can also be implemented in other types of resonators, including devices that are similar to FBARs but referred to in different terms.

According to certain aspects, FBARs can include a raised frame to improve quality factor Q above a resonance frequency fs. Generally, in FBARs, leakage of laterally propagating modes out of an active region can cause the quality factor Q to decrease. In addition, mode conversion from the main mode to lateral modes can also cause the quality factor Q to decrease. A raised frame can act as a reflector that reflects lateral modes back to the active region and can improve the quality factor Q. However, having only one raised frame may not be sufficient to reflect all the lateral modes. To strengthen the reflection and achieve maximum mode reflection, one may form multiple reflectors, such as two or more raised frames, for example, by forming different unmatched acoustic impedance interfaces. However, forming multiple reflectors can create a number of discontinuous boundaries, which can increase mode conversion.

According to certain aspects, FBARs including one or more raised frames including tapered regions and non-tapered regions can be provided. Such raised frames can be efficient in suppressing lateral mode leakage. For example, a raised frame including tapered regions and non-tapered regions can act as multiple reflectors, which can improve reflection efficiency. As another example, a raised frame including tapered regions and non-tapered regions can reduce the mode conversion from the main mode to other modes that occurs at discontinuous boundaries. As mentioned above, in addition to mode reflection, mode conversion can also affect the quality factor Q. A raised frame including tapered regions and non-tapered regions can create quasi-continuous boundaries and suppress mode conversion from the main mode to other modes. In some embodiments, the quality factor Q can be improved significantly at a low taper angle due to quasi-continuous boundaries and multiple reflections.

FIG. 1A illustrates a side view of a FBAR device 100 including laterally distributed raised frames including an inner reflector 105 and an outer reflector 115. The FBAR device 100 can include a first metal layer 110, a second metal layer 120, and a piezoelectric layer 130 between the first metal layer 110 and the second metal layer 120. A resonator can be formed by positioning the piezoelectric layer 130 between the first metal layer 110 and the second metal layer 120. In some embodiments, a portion of the piezoelectric layer 130 that overlaps with the first metal layer 110 and the second metal layer 120 can be referred to as a "resonator." In some embodiments, a metal layer 110, 120 may be referred to as an "electrode." A radio-frequency (RF) signal can be applied to one of the metal layers 110, 120 and can cause an acoustic wave to be generated in the piezoelectric layer 130. The acoustic wave can travel through the piezoelectric layer 130 and can be converted to an RF signal at the other one of the metal layers 110, 120. In this way, the FBAR device 100 can provide filtering functionality. In the FBAR device 100, acoustic waves can travel in a vertical direction (e.g., perpendicular to the metal layers 110, 120 and the piezoelectric layer 130). For example, the vertical direction can be a Z-direction. Some acoustic waves may travel in a horizontal direction (e.g., parallel to the metal layers 110, 120 and the piezoelectric layer 130). For example, the horizontal direction may be a X-direction, Y-direction, or a combination thereof.

The FBAR device 100 can include one or more raised frames ("RaFs"). In the example of FIG. 1A, the FBAR device 100 includes a first raised frame 140 and a second raised frame 150. For example, the first raised frame 140 can be on top of the second metal layer 120, and the second raised frame 150 can be below the second metal layer 120, between the second metal layer 120 and the piezoelectric layer 130. Each raised frame can include a tapered portion and a non-tapered portion or a tapering end and a non-tapered portion or non-tapering end. As shown in the example of FIG. 1A, the first raised frame 140 and second raised frame 150 can each include a tapered region and a non-tapered region on each side of a FBAR device.

Figure 1B:
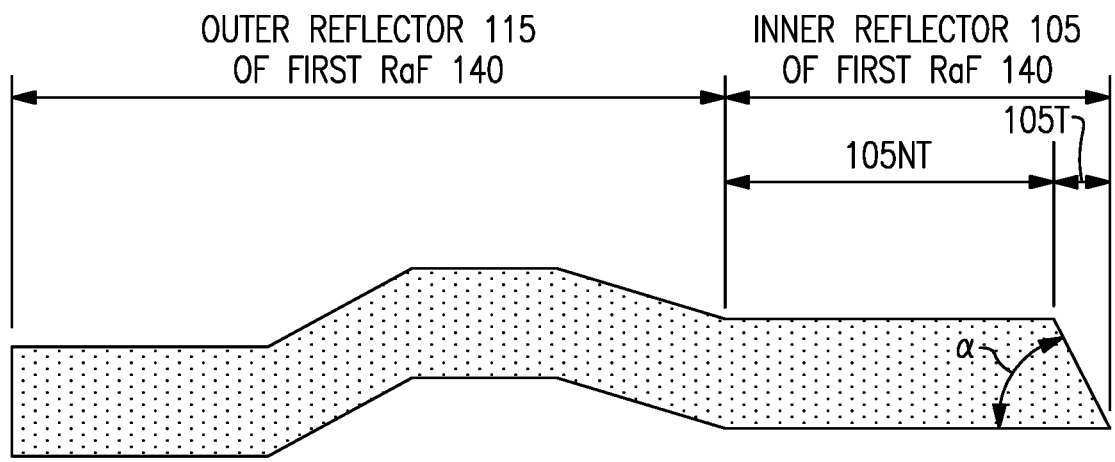
FIG. 1B is an enlarged cross-sectional view of a first raised frame of the FBAR device of FIG. 1A.
Figure 1C:
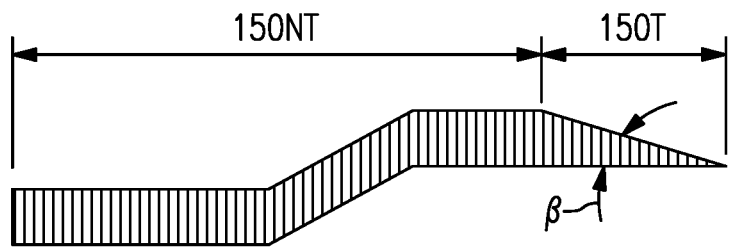
FIG. 1C is an enlarged cross-sectional view of a second raised frame of the FBAR device of FIG. 1A.

FIG. 1B is an enlarged view of the first raised frame 140 indicating the inner reflector region 105, the outer reflector region 115, the tapered region 105T of the inner reflector region 105, and the non-tapered region 105NT of the inner reflector region 105 of the first raised frame 140. FIG. 1C is an enlarged view of the second raised frame 150 indicating the tapered region 150T and the non-tapered region 150NT of the second raised frame 150. In the embodiment of FIG. 1A the second raised frame 150 does not have inner and outer reflector regions, but is present only beneath the outer reflector region 115 of the first raised frame 140.

The non-tapered regions of the first raised frame 140 and second raised frame 150 may have substantially constant heights or thicknesses across their horizontal extents. Small deviations in thickness in non-tapered regions of the first raised frame 140 and second raised frame 150 where the upper or lower surfaces of the first raised frame 140 and second raised frame 150 alter slope to conform to adjacent upper or lower material layers may be present but the non-tapered regions of the first raised frame 140 and second raised frame 150 may still be considered to have substantially constant heights or thicknesses across their horizontal extents. As illustrated in FIGS. 1A-1C, the non-tapered regions of the first raised frame 140 and second raised frame 150 can be adjacent to and contiguous with the non-tapered regions the first raised frame 140 and second raised frame 150.

A tapered region of a raised frame can have a degree of tapering defined by an angle $\alpha$, for example, with respect to the horizontal direction. The angle $\alpha$ may also be referred to as a "taper angle." In some embodiments, the angle $\alpha$ can be less than 90°. In some embodiments, $\alpha$ may be between 5° and 45° inclusive. In the embodiment of FIG. 1A, the angle $\alpha$ refers to the taper angle of the tapered region 105T of the first raised frame 140. The symbol $\beta$ is used to refer to the taper angle of the tapered portion 150T of the second raised frame 150. The angle $\beta$ can be less than 90° or may be between 10° and 60° inclusive. Angles $\alpha$ and $\beta$ may be the same or may be different in different embodiments.

In certain embodiments, a tapered region of a raised frame can have a triangular shape. In other embodiments, a tapered region of a raised frame can have other polygonal shapes. In some embodiments, the first raised frame 140 and the second raised frame 150 can have overlapping regions. For example, the tapered region 105T of the first raised frame 140 and the tapered region 150T of the second raised frame 150 can overlap at least in part, for example, in the horizontal direction. The metal layers 110, 120 and the piezoelectric layer 130 can follow the contour or shape of the first raised frame 140 and/or the second raised frame 150. Accordingly, the metal layers 110, 120 and the piezoelectric layer 130 may include portions that are parallel to the horizontal direction as well as portions that are at an angle with respect to the horizontal direction.

A raised frame can be made of or from any suitable material. In some embodiments, a raised frame can be made of or from a similar or the same material as the second metal layer 120 and/or the first metal layer 110. For example, a raised frame can be made of a heavy material. In certain embodiments, a raised frame can be made of or from a low acoustic impedance material. For example, a raised frame can be made of silicon dioxide, silicon nitride, etc. A raised frame may be made of any low density material. In the embodiment of FIG. 1A, for example, the first raised frame may be formed of a metal, and the second raised frame may be formed of silicon dioxide. The first raised frame 140 may formed of a material with a higher acoustic impedance than a material of which the second raised frame 150 is formed and a higher acoustic impedance than the material of the piezoelectric layer 130. The second raised frame 150 may formed of a material with a lower acoustic impedance than a material of which the first raised frame 140 is formed and a lower acoustic impedance than the material of the piezoelectric layer 130. Tapered regions of raised frames can be formed during the manufacturing process for forming a FBAR device (e.g., by deposition process).

In the example of FIG. 1A, the FBAR device 100 is shown to include two raised frames for illustrative purposes, but the number of raised frames included in the FBAR device 100 can vary as appropriate, depending on the embodiment. For example, in some embodiments, the FBAR device 100 can include one raised frame or more than two raised frames. One or more raised frames can be positioned in various configurations. One or more raised frames can be placed at various positions along the vertical direction (e.g., perpendicular to the metal layers 110, 120 and the piezoelectric layer 130). For example, one or more raised frames can be placed at a position above or below the first metal layer 110, above or below the second metal layer 120, between the first metal layer 110 and the second metal layer 120, or any combination thereof. Various examples of configurations of raised frames are described in more detail below.

The FBAR device 100 can include an active region 160, for example, between the tapered regions 105T of the inner reflector regions 105 of the first raised frame 140 on each side of the FBAR device 100. Main mode waves can travel through the active region 160. For instance, the active region 160 can be a preferred region through which main mode waves can travel. Viewed from a top-down perspective, the active region 160 can have a cylindrical shape, a rectangular shape, or other suitable shapes. In some embodiments, the FBAR device 100 can include a passivation layer 180 above the first raised frame 140 and second metal layer 120. The passivation layer 180 can be on top of the first raised frame 140 and an exposed portion of the second metal layer 120. The exposed portion of the second metal layer 120 can be a portion that is not covered by the first raised frame 140. In certain embodiments, the FBAR device 100 may also include recessed frame (ReF) regions 185 that may be defined by thinned portions of the passivation layer 180 and that define outer boundaries of the active region 160. The passivation layer 180 may be thinner in the recessed frame regions 185 than in the active region 160. The thickness of the passivation payer 180 in the recessed frame regions 185 can be similar to or the same as the thickness of the passivation layer 180 over the first raised frame 140 in the inner reflector region 105 and/or outer reflector region 115. In some embodiments, the recessed frame region 185 can be a contiguous ring structure surrounding the active region 160. The passivation layer 180 may be formed of a dielectric material, for example, silicon dioxide or silicon nitride. In some embodiments, the FBAR device 100 can include a substrate 170 and include an air cavity 190 below the first metal layer 110. In some embodiments, a distal end of the first metal layer 110 may be separated from the adjacent region of the substrate 170 by a gap 110G.

By creating quasi-continuous boundaries, a raised frame including tapered and non-tapered regions can increase mode reflection and decrease mode conversion. For example, the quasi-continuous boundaries can act as multiple reflectors to increase mode reflection. The quasi-continuous boundaries can also suppress mode conversion. In this manner, FBAR devices including one or more raised frames having tapered and non-tapered regions can have improved values for the quality factor Q. In some embodiments, lower taper angles for gradient raised frames can be more effective in increasing mode reflection and decreasing mode conversion. For example, the taper angle for a tapered region of a raised frame can be less than 45°, or less than 30°, between 10° and 60°, or between 5° and 45° as discussed above. The taper angle can be selected to maximize mode reflection and reduction of mode conversion.

Figure 2:
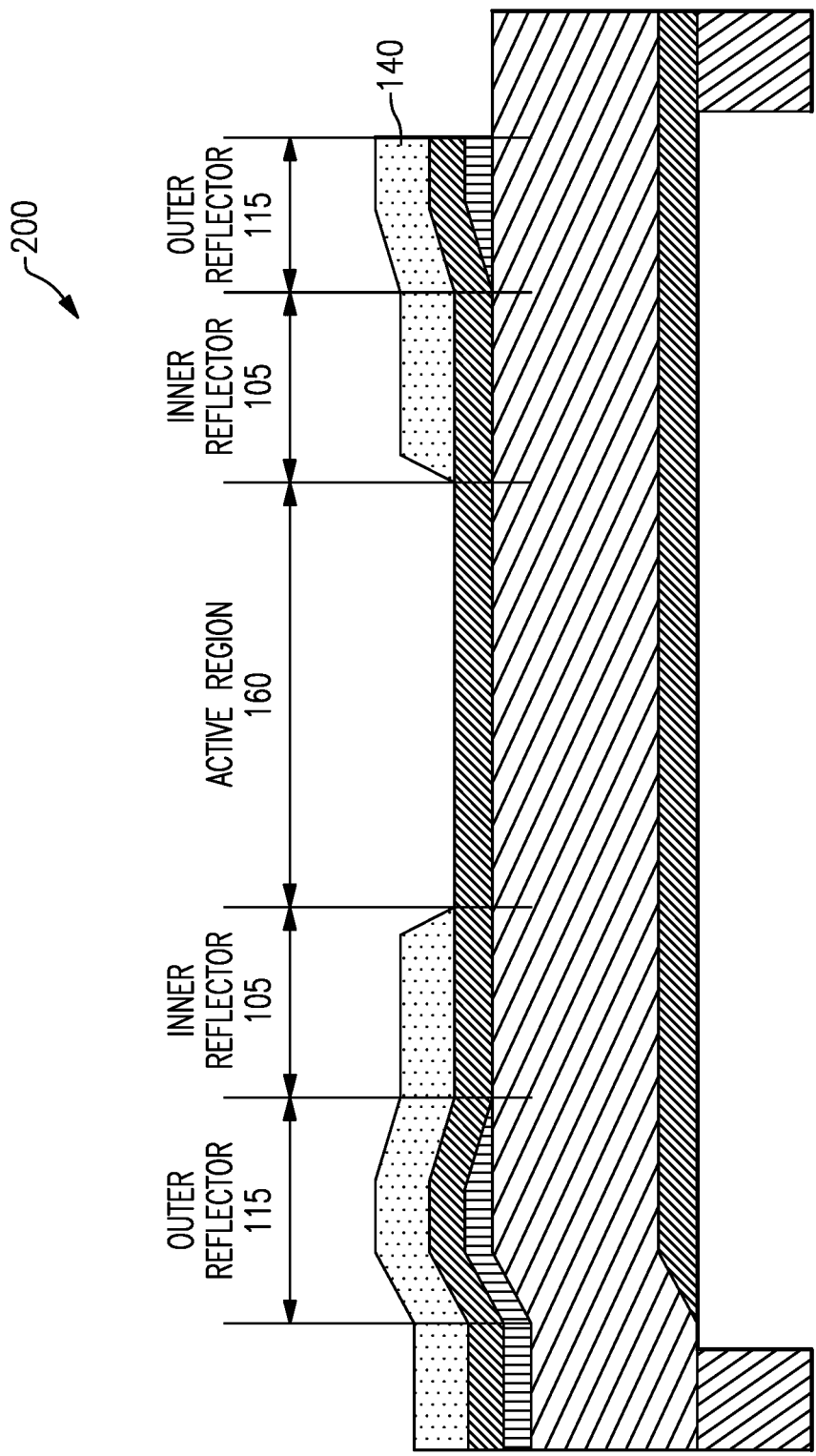
FIG. 2 is a cross-sectional view of another example of a FBAR device including one or more tapered raised frames.

FIG. 2 illustrates a side view of a FBAR device 200 that is similar to the FBAR device 100 of FIG. 1, except that the FBAR device 200 does not include a passivation layer 180. The outer boundaries of the active region 160 in the embodiment of FIG. 2 are defined by the inner edges of the inner reflectors 105 of the first raised frame 140.

Figure 3:
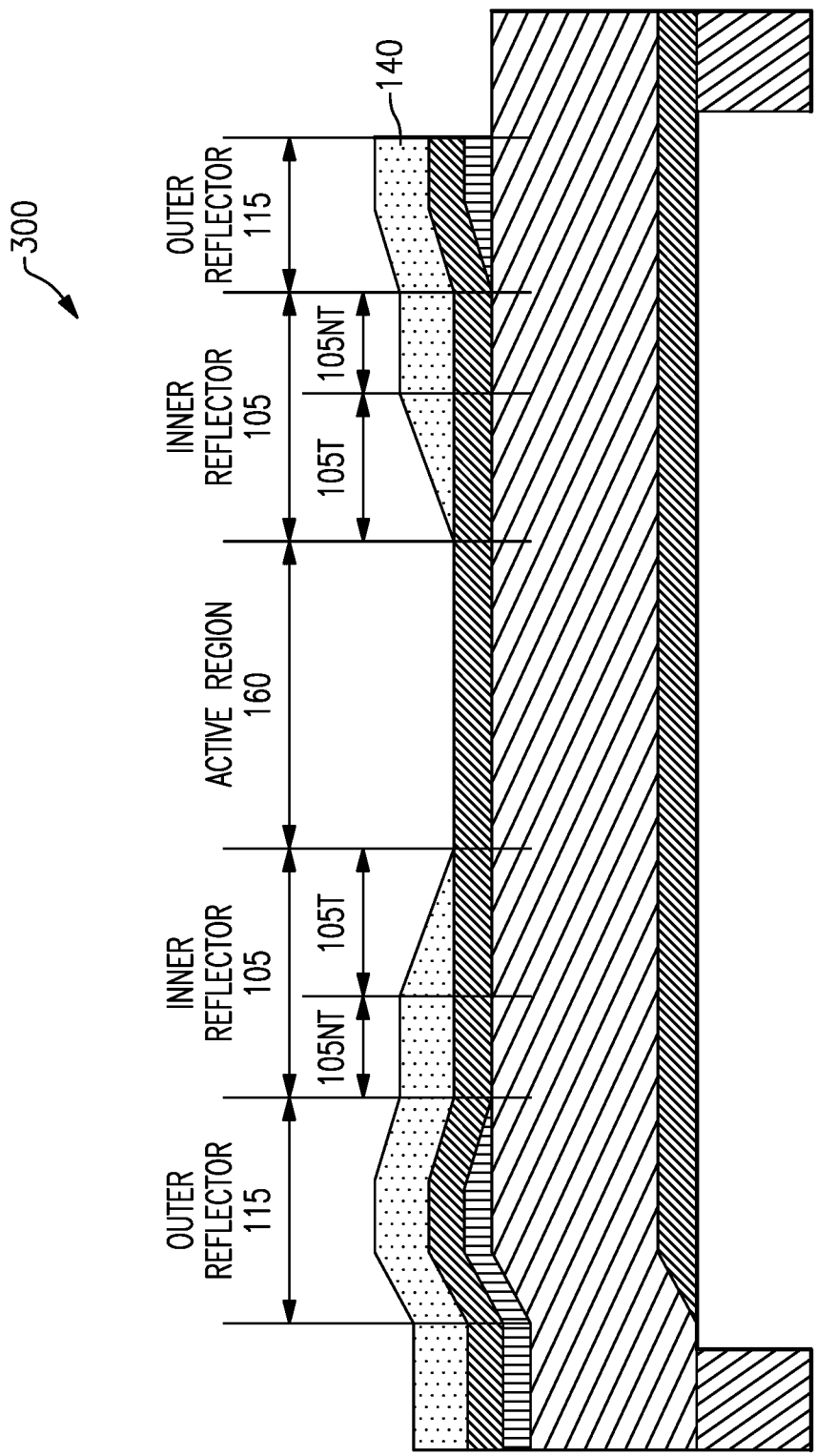
FIG. 3 is a cross-sectional view of another example of a FBAR device including one or more tapered raised frames.

FIG. 3 illustrates a side view of a FBAR device 300 that is similar to the FBAR device 200 of FIG. 2, except that the FBAR device 300 includes tapered regions 105T of the inner reflector portions 105 of the first raised frame 140 that are wider than the non-tapered regions 105NT of the inner reflector portions 105 of the first raised frame 140. This contrasts with the FBAR devices 100, 200 of FIGS. 1 and 2, respectively, in which the non-tapered regions 105NT of the inner reflector portions 105 of the first raised frame 140 are wider than the tapered regions 105T of the inner reflector portions 105 of the first raised frame 140. It is to be appreciated that in other embodiments, the non-tapered regions 105NT of the inner reflector portions 105 of the first raised frame 140 may be as wide as or substantially as wide as the tapered regions 105T of the inner reflector portions 105 of the first raised frame 140. In some embodiments, the FBAR device 300 may include a passivation layer 180 and recessed frame regions 185 similar to what is illustrated in FIG. 1 for the FBAR device 100.

Figure 4:
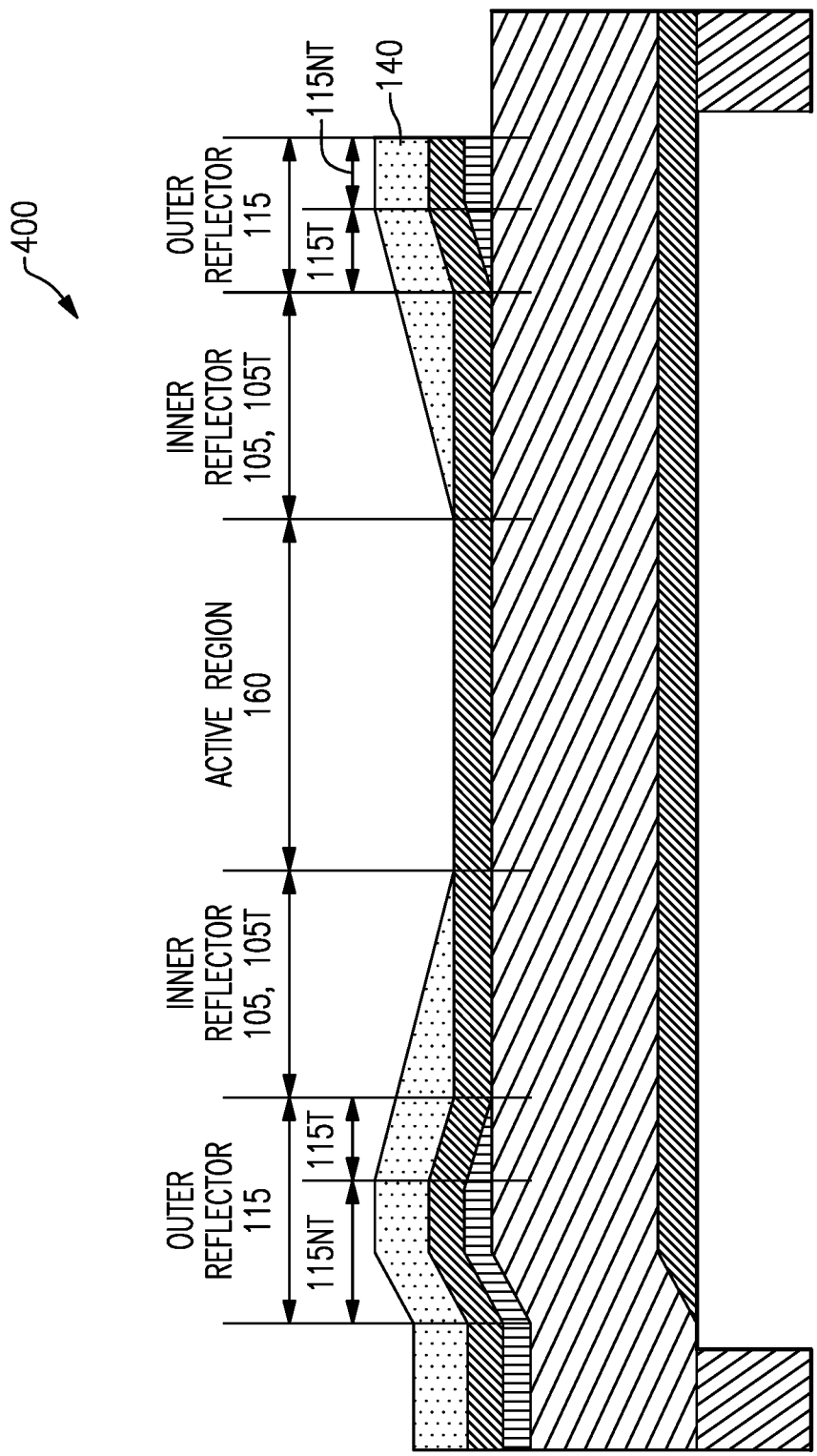
FIG. 4 is a cross-sectional view of another example of a FBAR device including one or more tapered raised frames.

FIG. 4 illustrates a side view of a FBAR device 400 that is similar to the FBAR device 300 of FIG. 3, except that the tapered region of the first raised frame 140 of FBAR device 400 extends through the entirety of the inner reflector regions 105 and into the outer reflector regions 115. The inner reflector regions 105 may thus be considered to be made up entirely of the tapered regions 105T. The outer reflector regions 115 may be considered to be broken into inner tapered regions 115T and outer non-tapered regions 115NT that are contiguous with the inner tapered regions 115T. In some embodiments, the FBAR device 400 may include a passivation layer 180 and recessed frame regions 185 similar to what is illustrated in FIG. 1 for the FBAR device 100.

Figure 5:
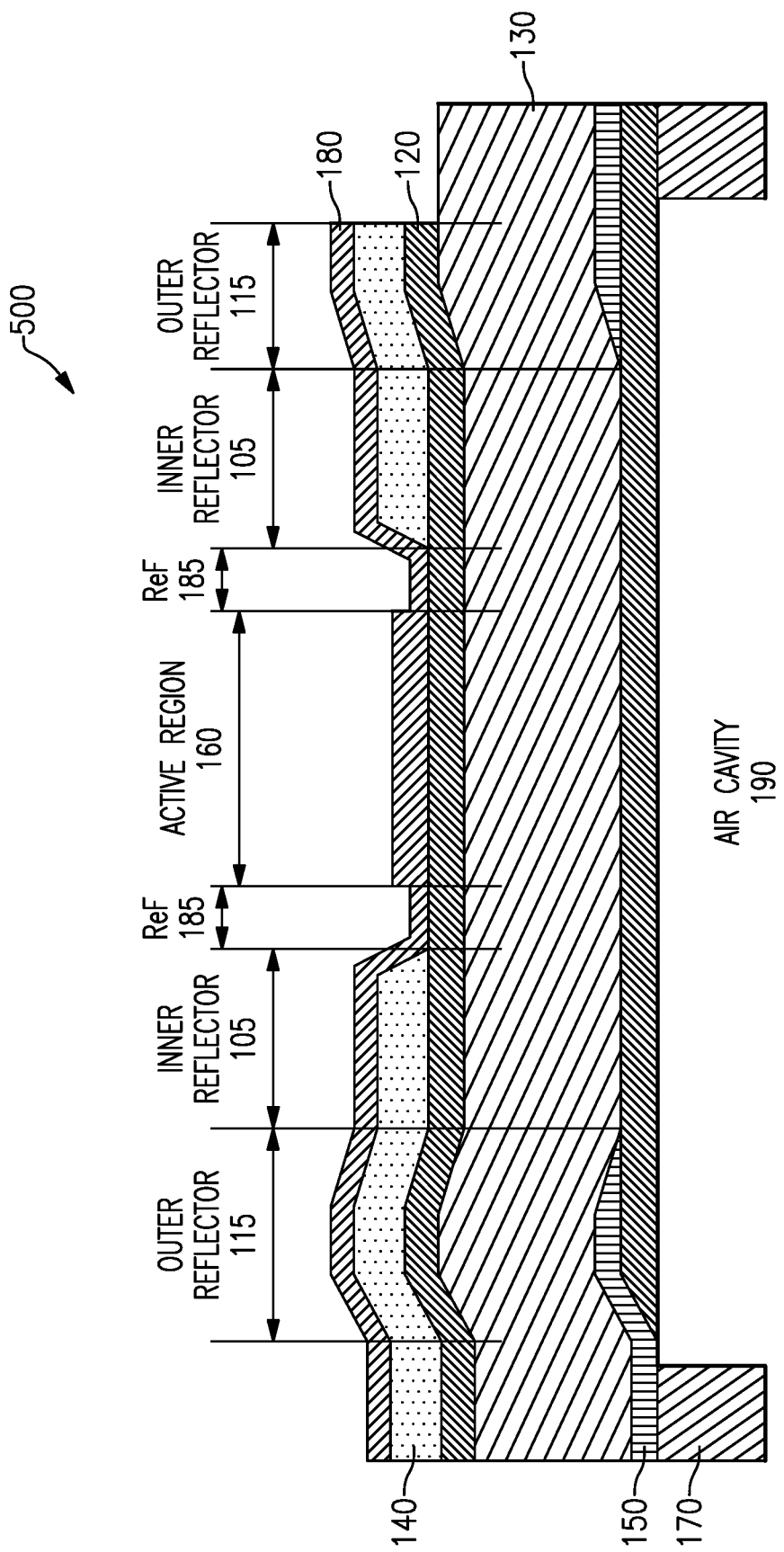
FIG. 5 is a cross-sectional view of another example of a FBAR device including one or more tapered raised frames.

FIG. 5 illustrates a side view of a FBAR device 500 that is similar to the FBAR device 100 of FIG. 1, except that in the FBAR device 500 the second raised frame raised frame 150 is disposed, in part, beneath the piezoelectric layer 130 between the first metal layer 110 and the piezoelectric layer 130. The second raised frame raised frame 150 may, in part, be disposed beneath the piezoelectric layer 130 between the substrate 170 and the piezoelectric layer 130. The second raised frame raised frame 150 may, in part, be disposed beneath the piezoelectric layer 130 between the air cavity 190 and the piezoelectric layer 130.

Figure 6:
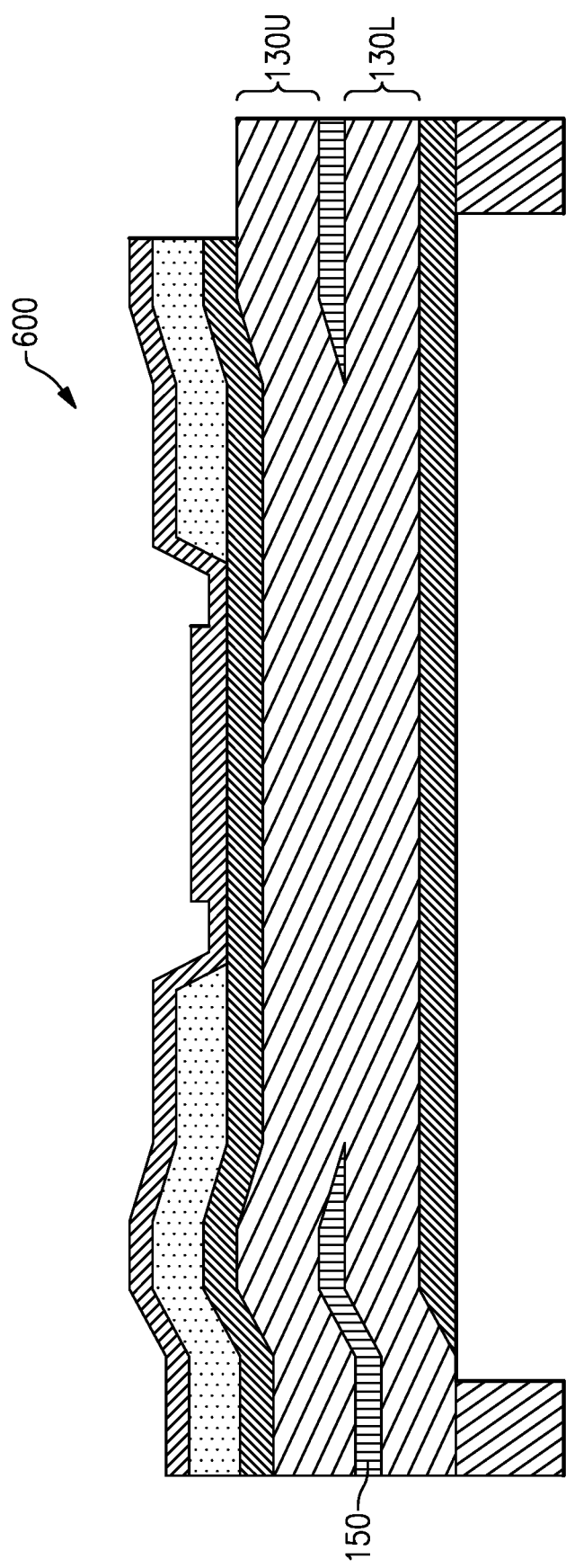
FIG. 6 is a cross-sectional view of another example of a FBAR device including one or more tapered raised frames.

FIG. 6 illustrates a side view of a FBAR device 600 that is similar to the FBAR device 500 of FIG. 5, except that in the FBAR device 600 the second raised frame raised frame 150 is disposed within the piezoelectric layer 130, rather than beneath the piezoelectric layer 130. The second raised frame 150 maybe considered to split the piezoelectric layer into an upper piezoelectric layer 130U and a lower piezoelectric layer 130L.

Figure 7:
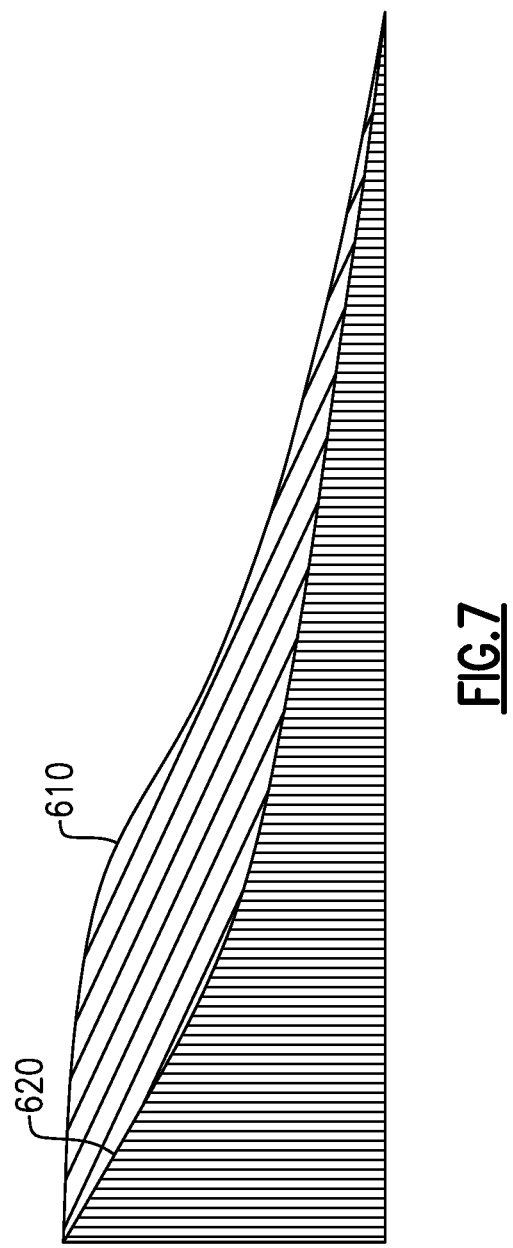
FIG. 7 illustrates examples of cross-sectional profiles of raised frame portions, according to certain embodiments.

In the embodiments discussed above, the tapered regions of the raised frames increase in width monotonically or linearly with horizontal distance away from the central active region 160 of the FBAR device. In other embodiments, for example, as illustrated in FIG. 7, the tapered regions of the raised frames may exhibit non-linear gradients. For example, a non-linear gradient can include a convex portion 610, a concave portion 620, or any combination thereof. The examples in FIG. 7 are provided for illustrative purposes, and many other variations of non-linear gradient raised frame portions are possible.

Figure 8:
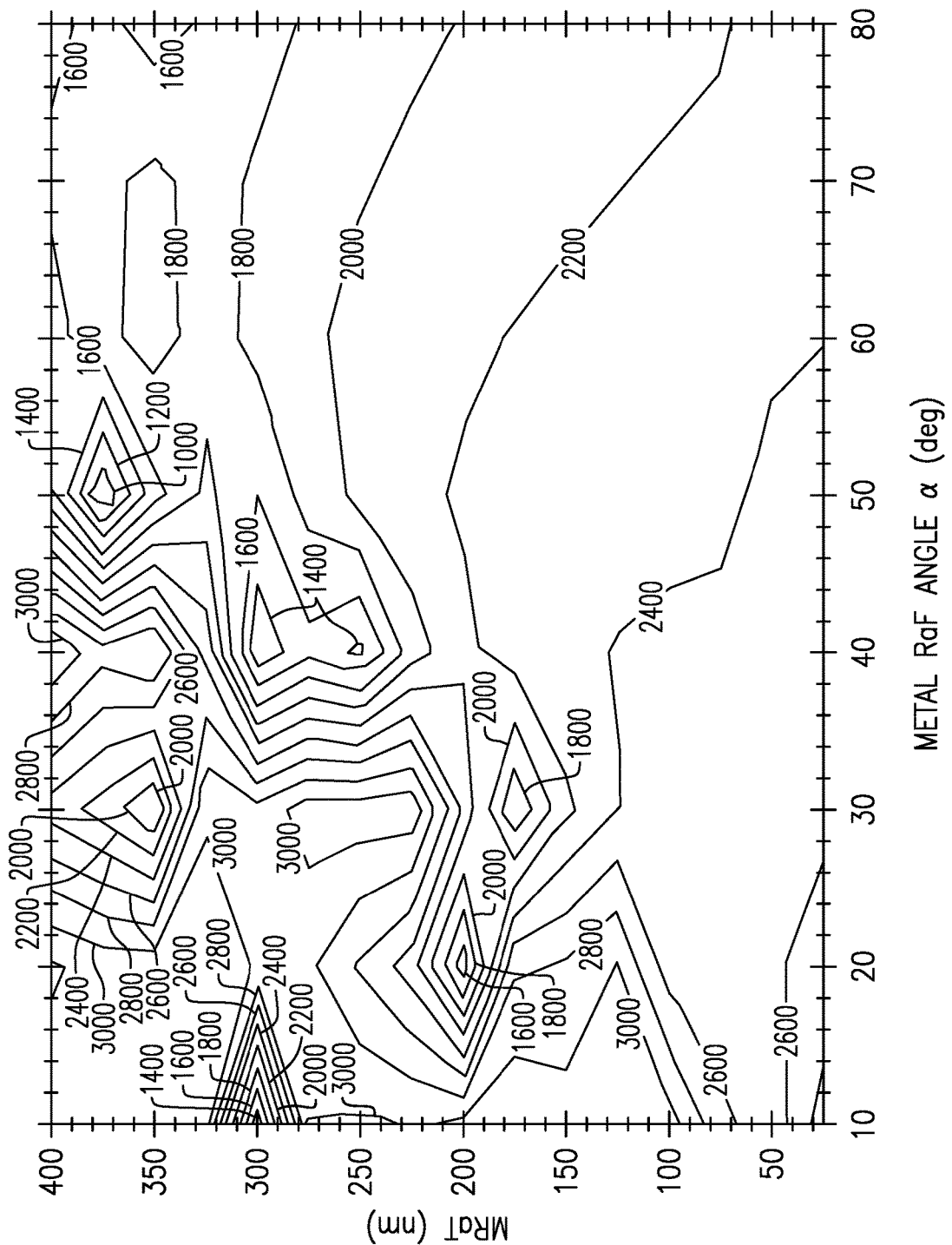
FIG. 8 illustrates results of a simulation of the effect of raised frame thickness and taper angle on quality factor in a FBAR device.

FIG. 8 illustrates results of a simulation of the effect of thickness of the non-tapered portion 115NT of the outer reflector portion 115 (MRaT parameter in the chart of FIG. 8) and taper angle α of the tapered portion 105T of the inner reflector portion 105 of a first raised frame 140 on quality factor Q at the antiresonance frequency in an example of a FBAR. In the simulated FBAR the width of the raised frame was 2 μm, the thickness of the passivation layer in the active region was 150 nm, the thickness of the first metal layer was 430 nm, the thickness of the piezoelectric layer was 600 nm, the thickness of the second metal layer was 440 nm, the thickness of the untampered portion of the second raised frame was 100 nm, and the width of the air cavity was 120 µm. The results shown in FIG. 8 indicate that quality factor may generally increase with raised frame thickness and with smaller taper angles, but may rise and fall periodically as either of these parameters increases or decreases.

Figure 9:
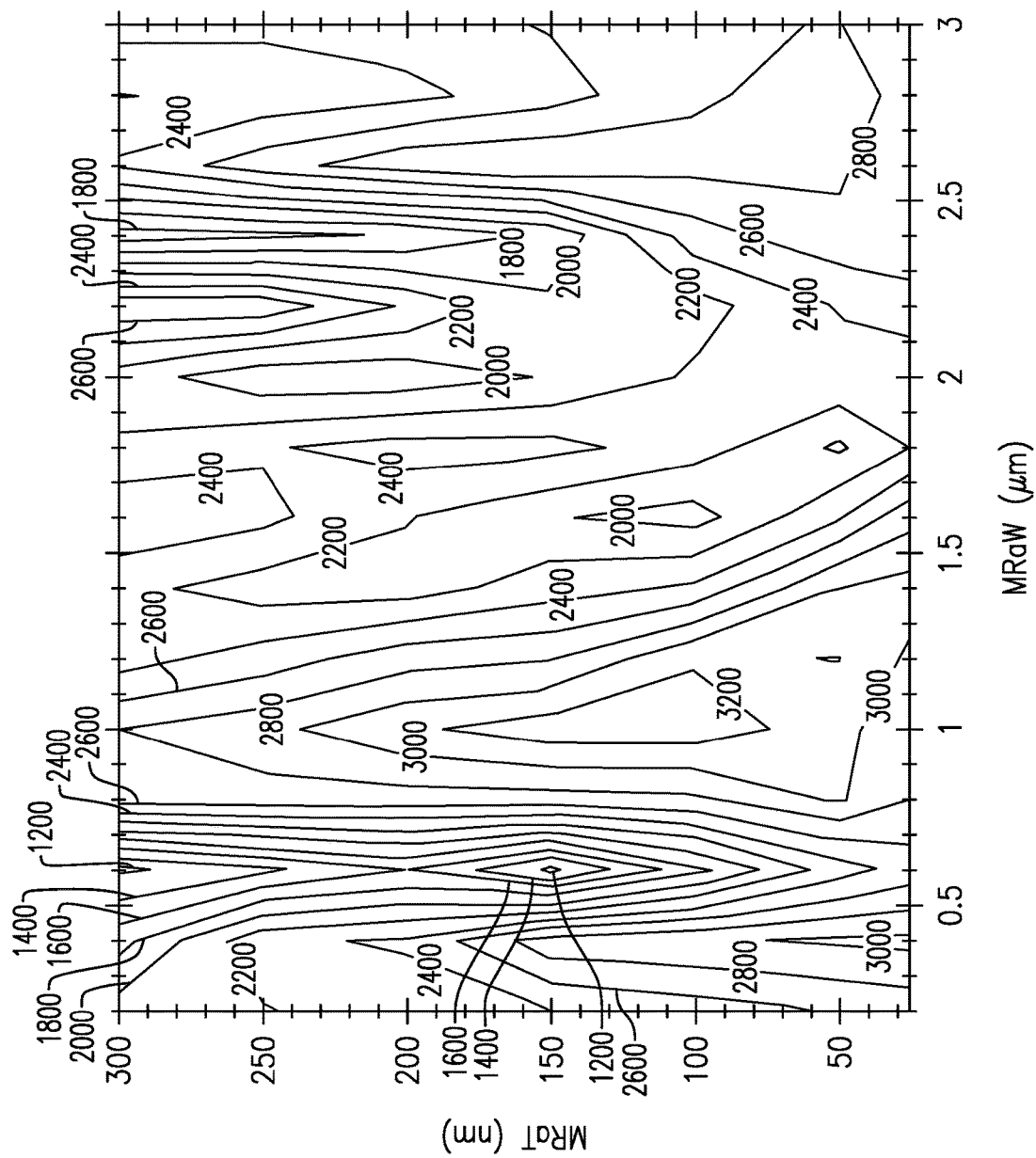
FIG. 9 illustrates results of a simulation of the effect of raised frame thickness and raised frame width on quality factor in a FBAR device.

FIG. 9 illustrates results of a simulation of the effect of thickness of the non-tapered portion 115NT of the outer reflector portion 115 (MRaT parameter in the chart of FIG. 9) and width of the inner reflector region of the first raised frame (MRaW parameter in the chart of FIG. 9) on quality factor Q at the antiresonance frequency in the same FBAR that was used to simulate the results illustrated in FIG. 8. The results in FIG. 9 illustrate that the highest Q may be found for an FBAR with a first raised fame inner reflector region width of about 1 µm and a first raised frame thickness of about 100 nm. Some periodicity with respect to Q value may be observed with changes in the first raised fame inner reflector region width.

Figure 10:
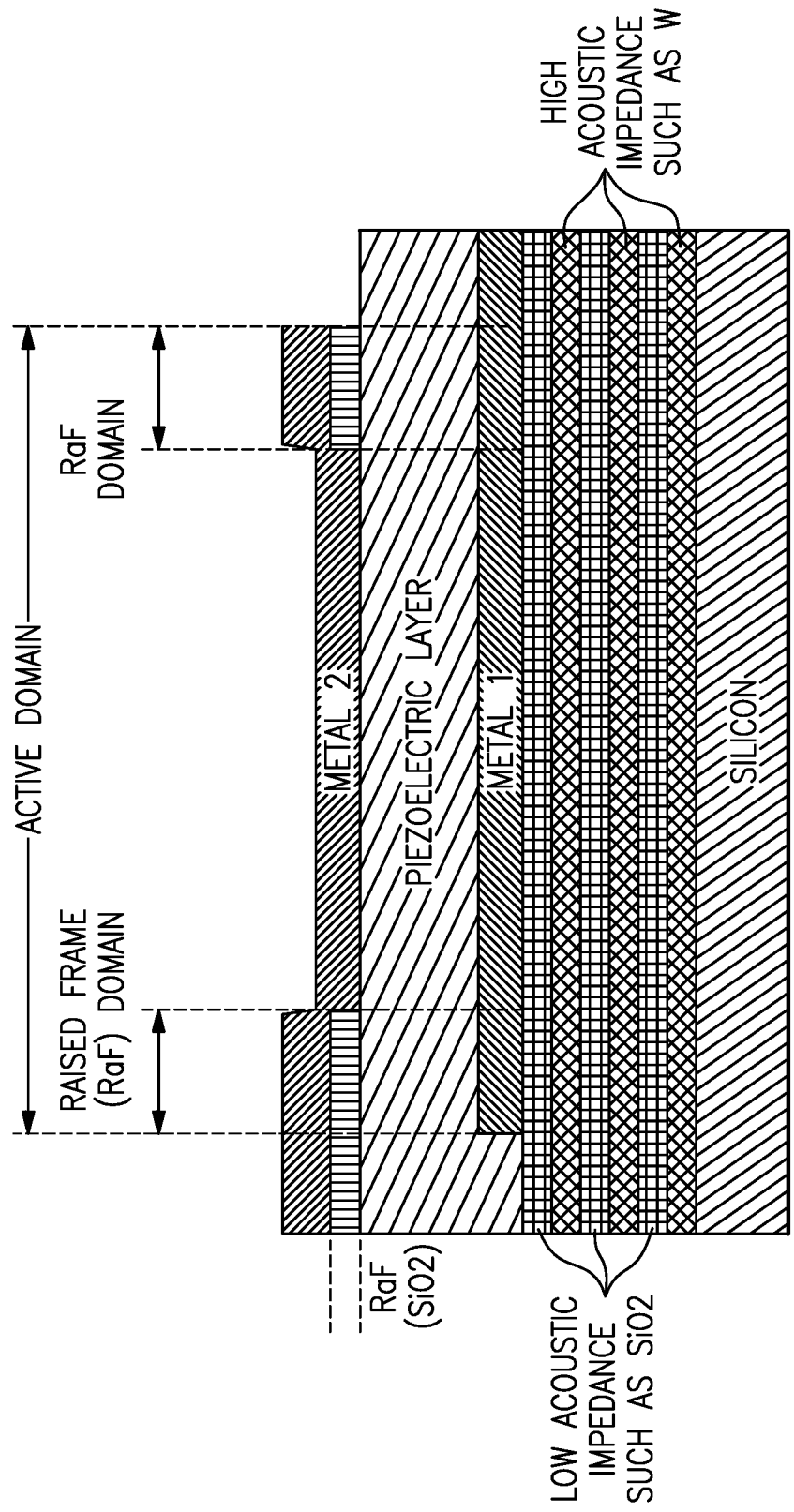
FIG. 10 is a cross-sectional view of an example of a solidly mounted resonator (SMR)

Aspects and embodiments of raised frame structures as disclosed herein may be utilized with not only FBAR devices as discussed above, but also with other form of bulk acoustic wave resonators, for example, solidly mounted resonators (SMRs). As illustrated in FIG. 10, an example of and SMR may include a piezoelectric layer formed of, for example, aluminum nitride or another suitable piezoelectric material, an upper electrode (the metal 2 layer in FIG. 10) disposed on an upper surface of the piezoelectric layer, and a lower electrode (the metal 1 layer in FIG. 10) disposed on lower surface of the piezoelectric layer. The piezoelectric layer and upper and lower electrodes may be disposed on a Bragg reflector formed of alternating layers of a first material with a high acoustic impedance, for example, tungsten, and a second material with a lower acoustic impedance than the first material, for example, $SiO_2$. The Bragg reflector may be mounted on a substrate, for example, a silicon substrate. The SMR may have a raised frame including a layer of a dielectric material, for example, $SiO_2$ (the raised frame layer illustrated in FIG. 10) disposed between the lower surface of the upper electrode and the piezoelectric material in a raised frame domain region of the resonator.

Figure 11A:
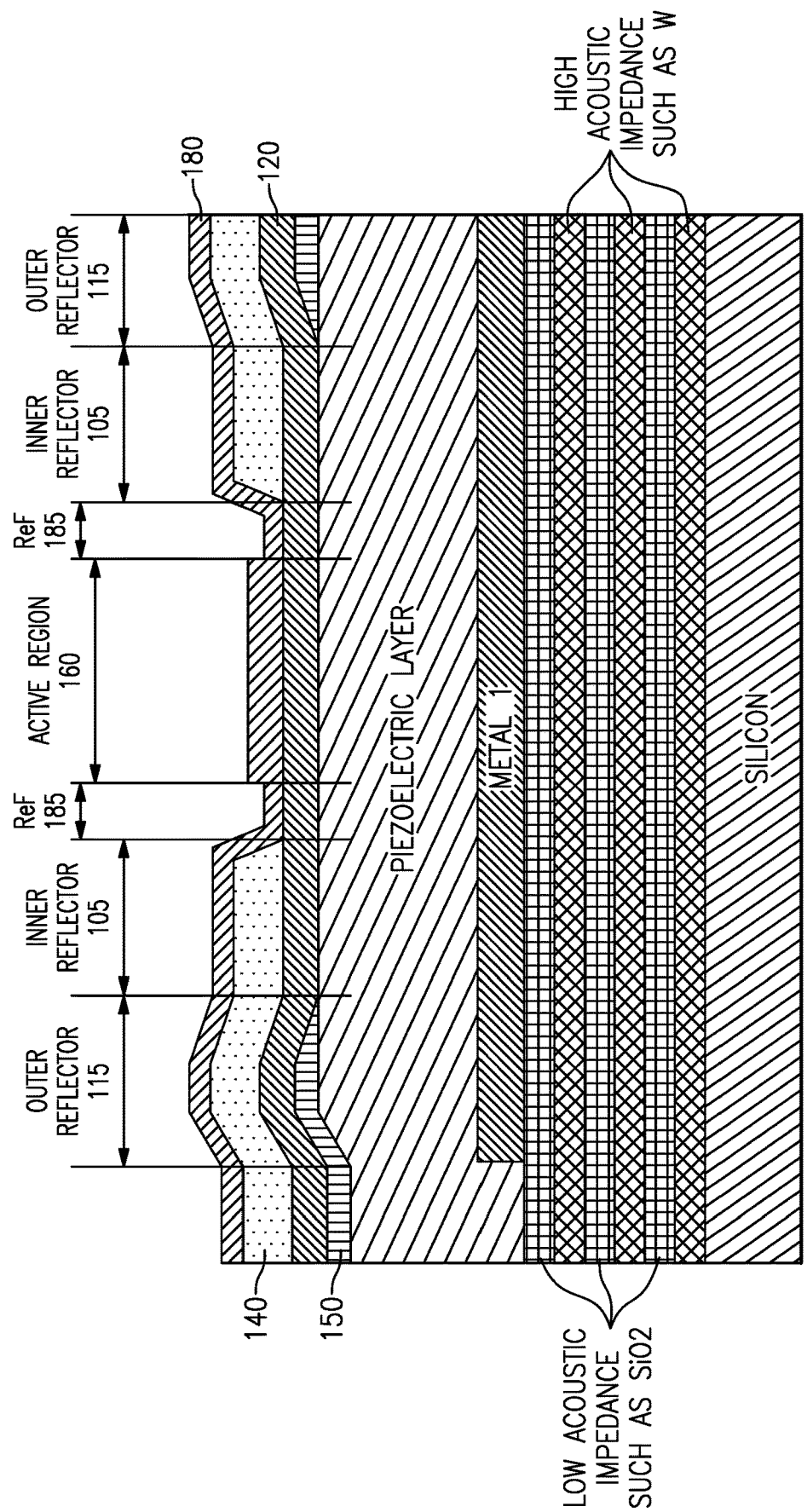
FIG. 11A is a cross-sectional view of an example of a SMR including one or more tapered raised frames.
Figure 11B:
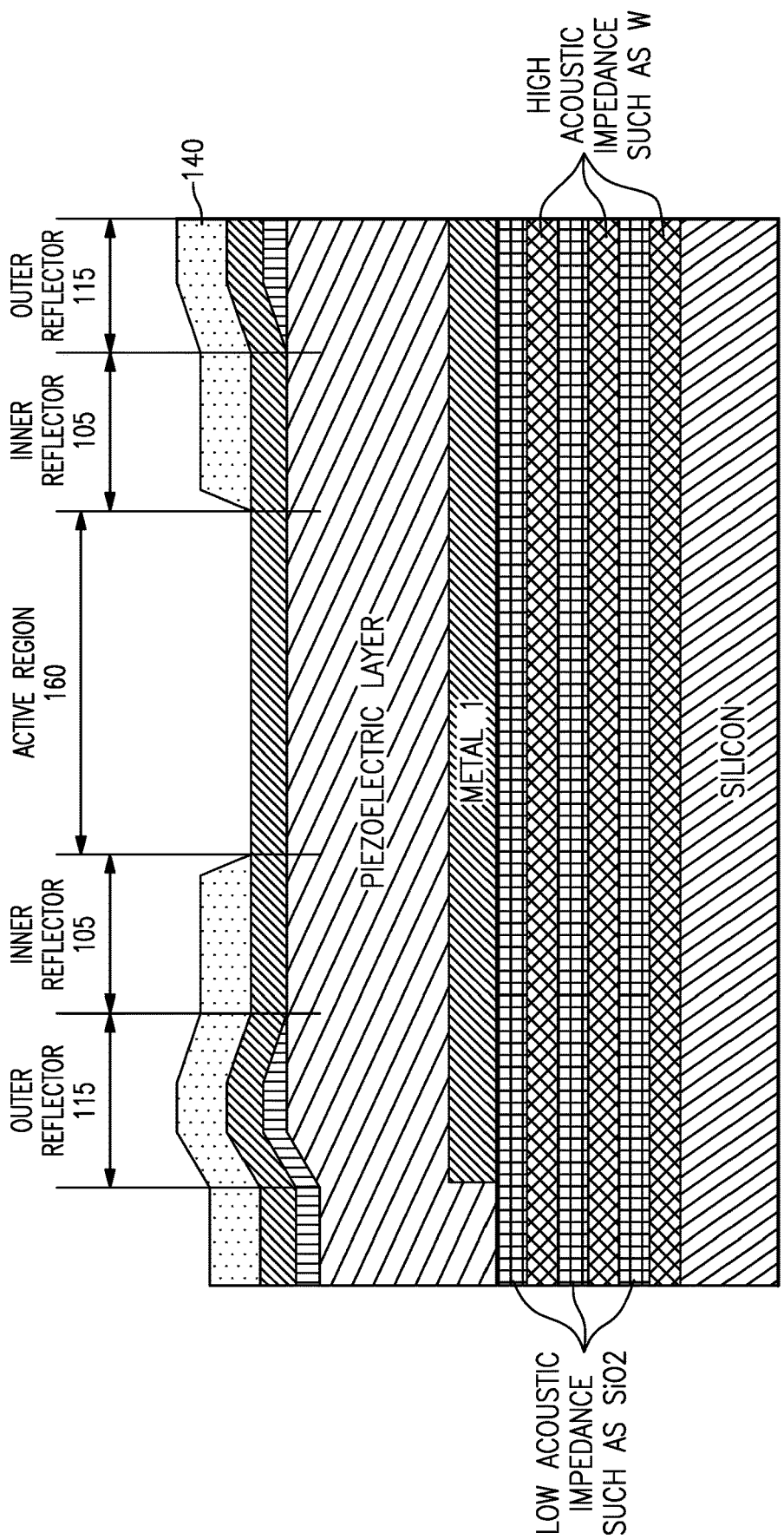
FIG. 11B is a cross-sectional view of another example of a SMR including one or more tapered raised frames.
Figure 11C:
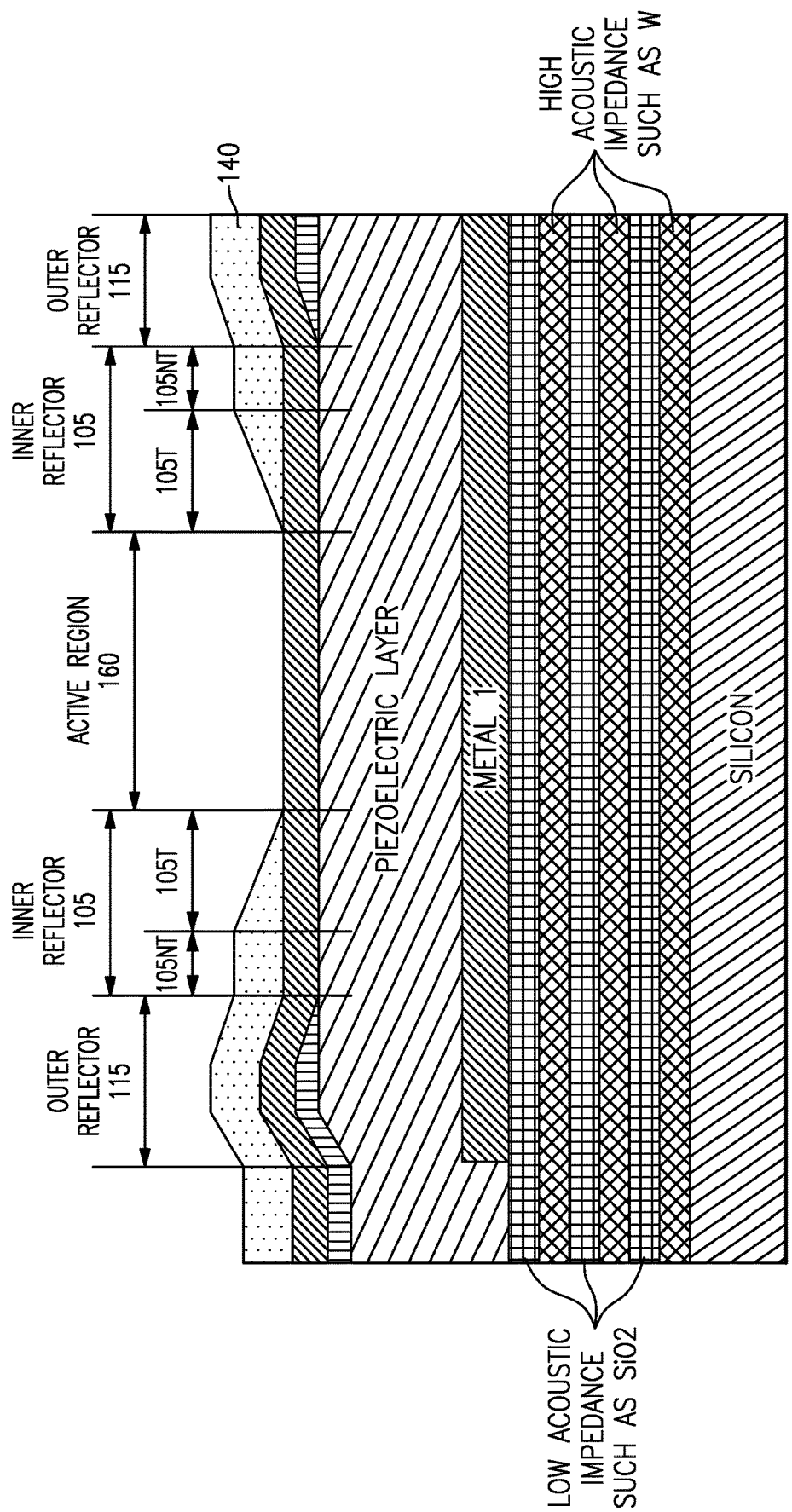
FIG. 11C is a cross-sectional view of another example of a SMR including one or more tapered raised frames.
Figure 11D:
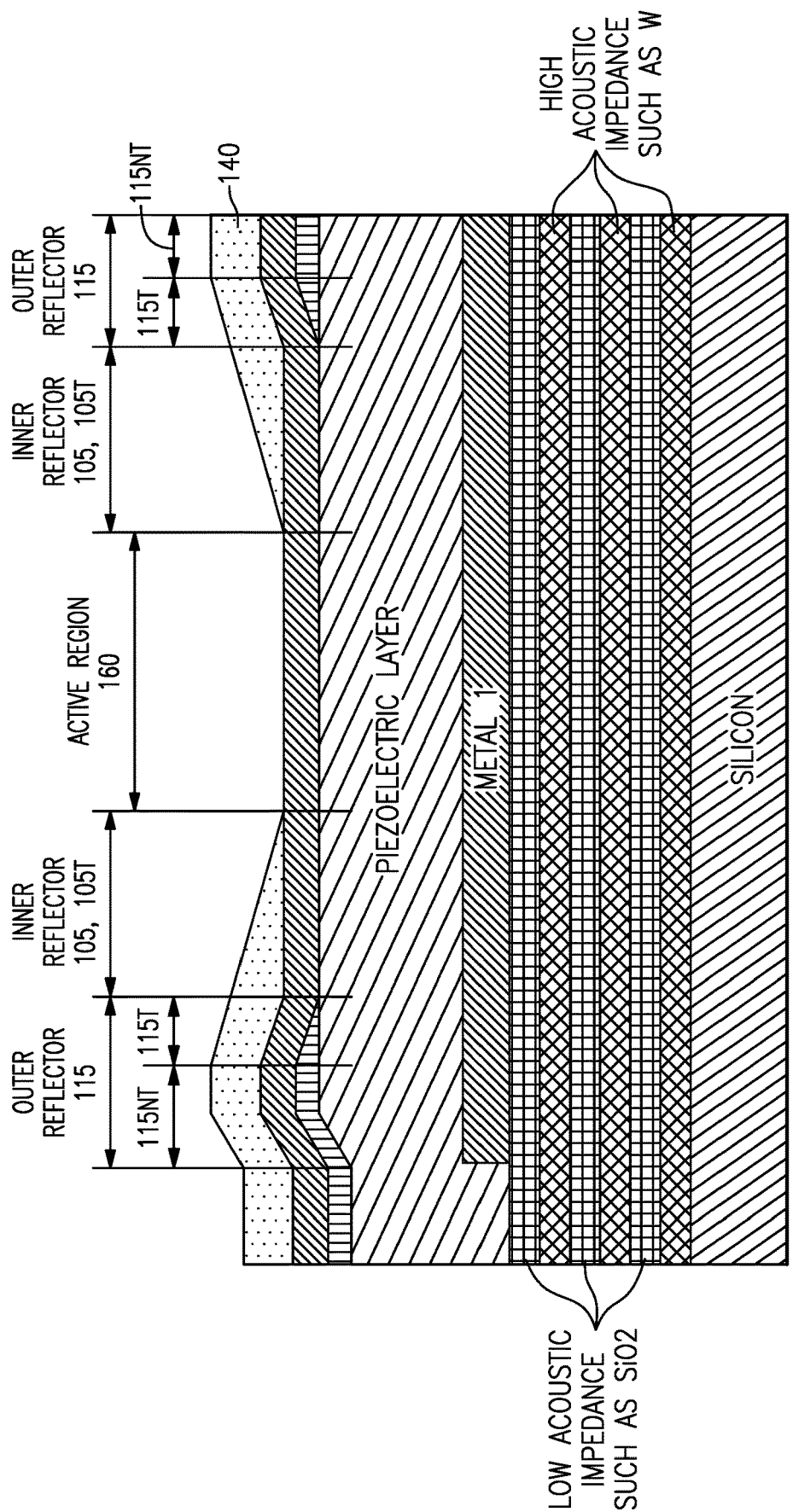
FIG. 11D is a cross-sectional view of another example of a SMR including one or more tapered raised frames.
Figure 11E:
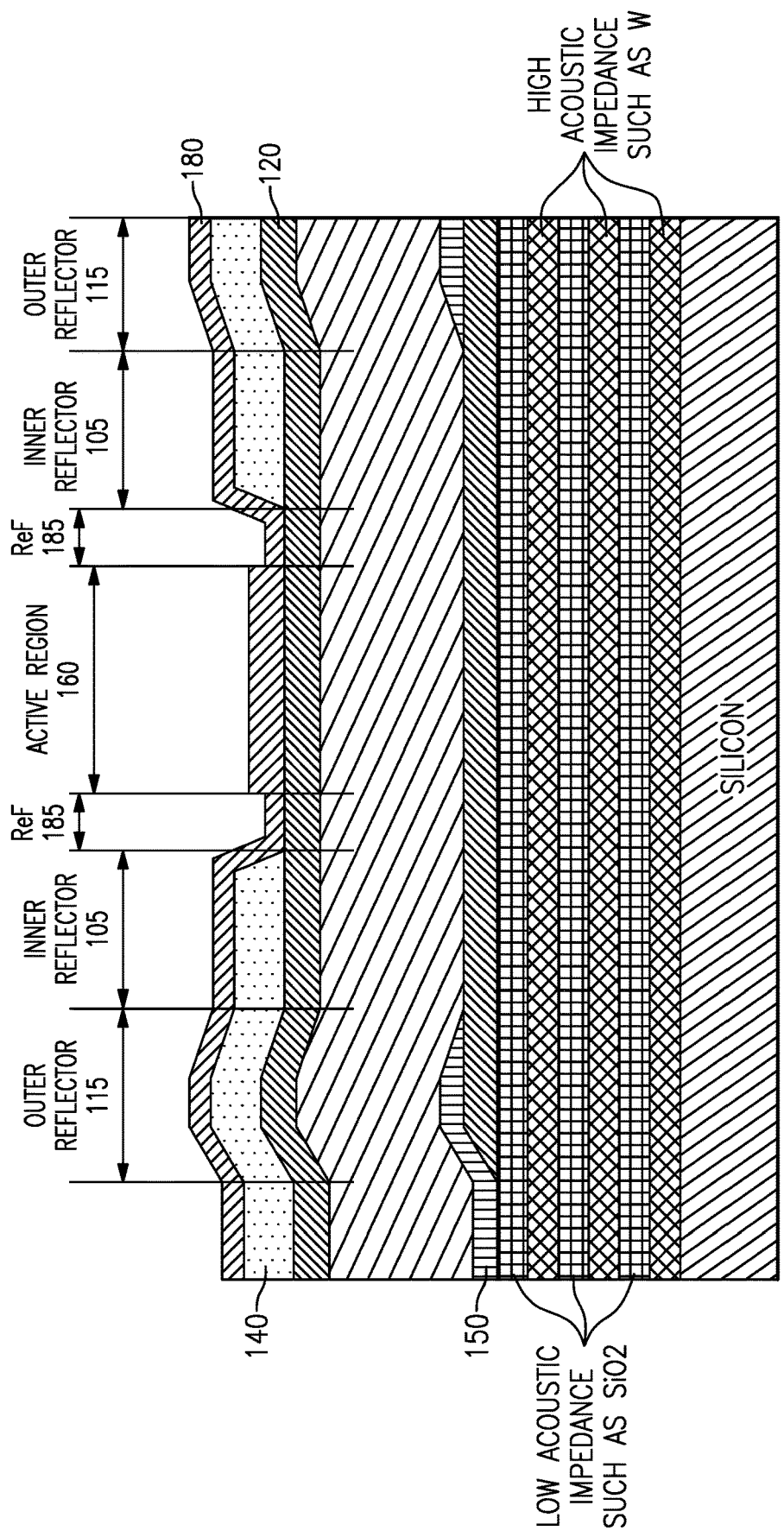
FIG. 11E is a cross-sectional view of another example of a SMR including one or more tapered raised frames.
Figure 11F:
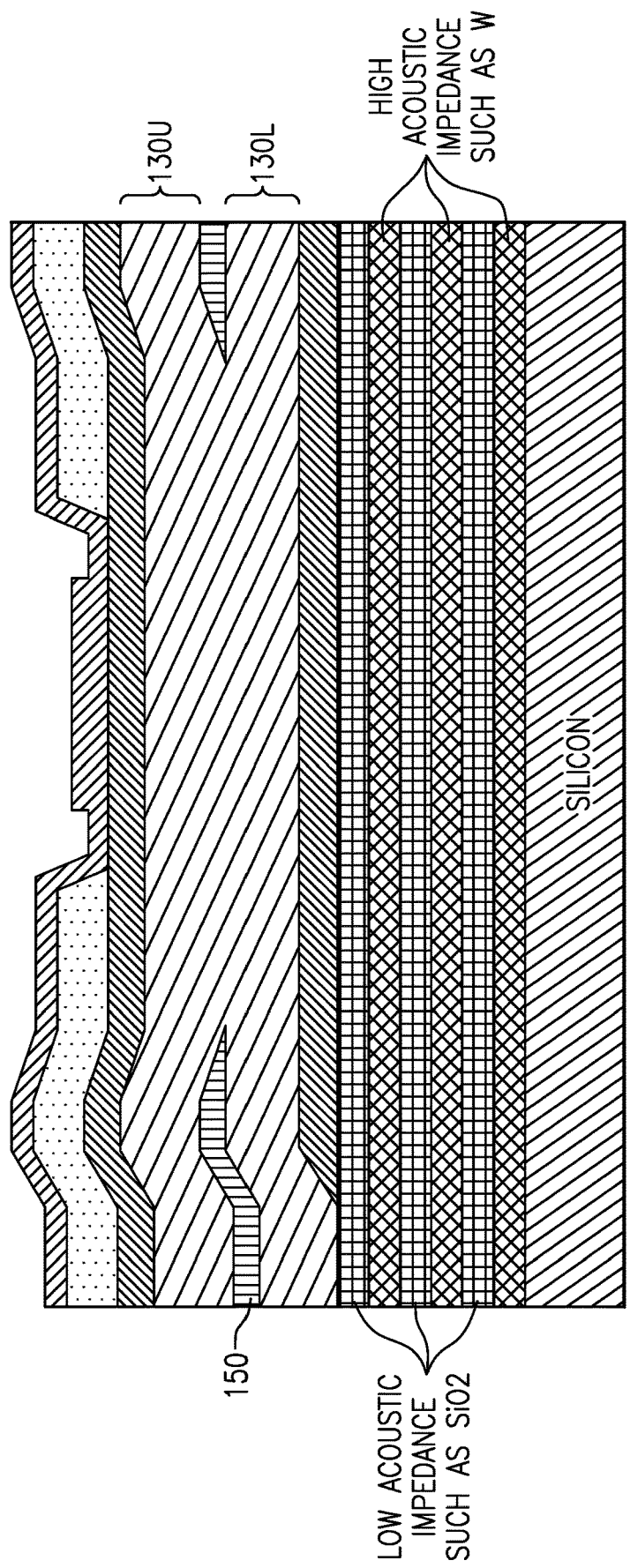
FIG. 11F is a cross-sectional view of another example of a SMR including one or more tapered raised frames.

FIG. 11A illustrates how a raised frame structure as illustrated in the FBAR of FIG. 1A may be utilized in a SMR. FIG. 11B illustrates how a raised frame structure as illustrated in the FBAR of FIG. 2 may be utilized in a SMR. FIG. 11C illustrates how a raised frame structure as illustrated in the FBAR of FIG. 3 may be utilized in a SMR. FIG. 11D illustrates how a raised frame structure as illustrated in the FBAR of FIG. 4 may be utilized in a SMR. FIG. 11E illustrates how a raised frame structure as illustrated in the FBAR of FIG. 5 may be utilized in a SMR. FIG. 11F illustrates how a raised frame structure as illustrated in the FBAR of FIG. 6 may be utilized in a SMR.

Figure 12:
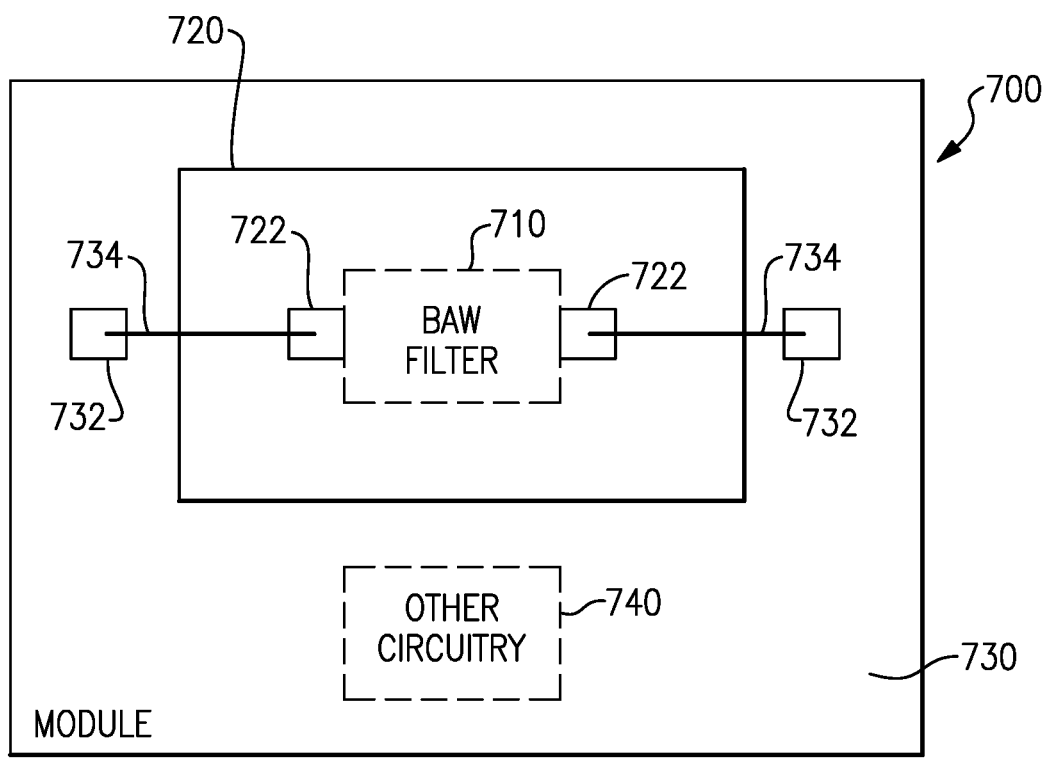
FIG. 12 is a block diagram of one example of a filter module that can include one or more acoustic wave elements according to aspects of the present disclosure.
Figure 13:
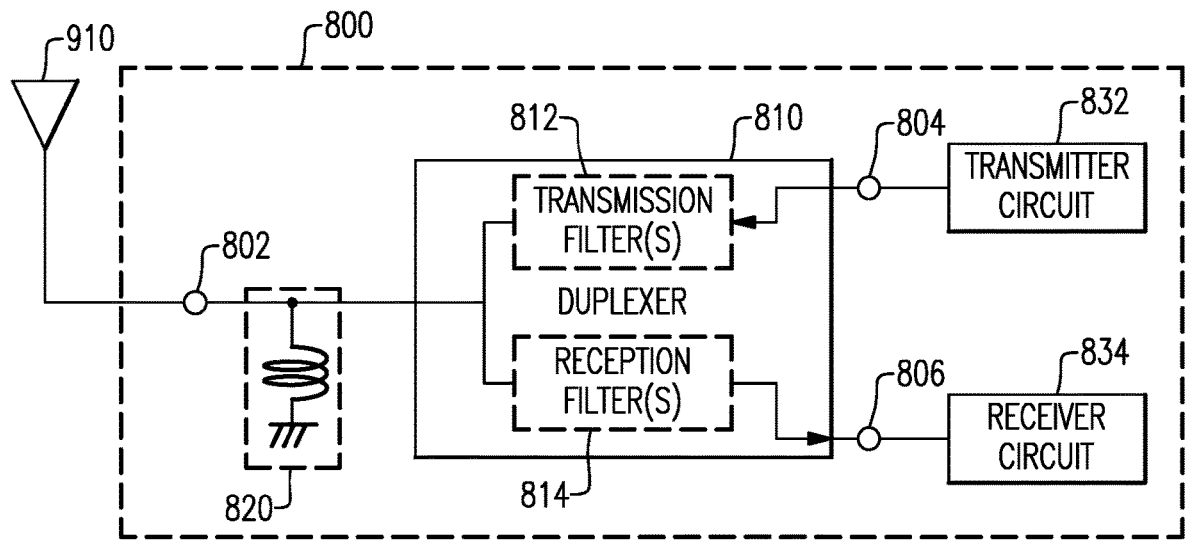
FIG. 13 is a block diagram of one example of a front-end module that can include one or more filter modules according to aspects of the present disclosure.
Figure 14:
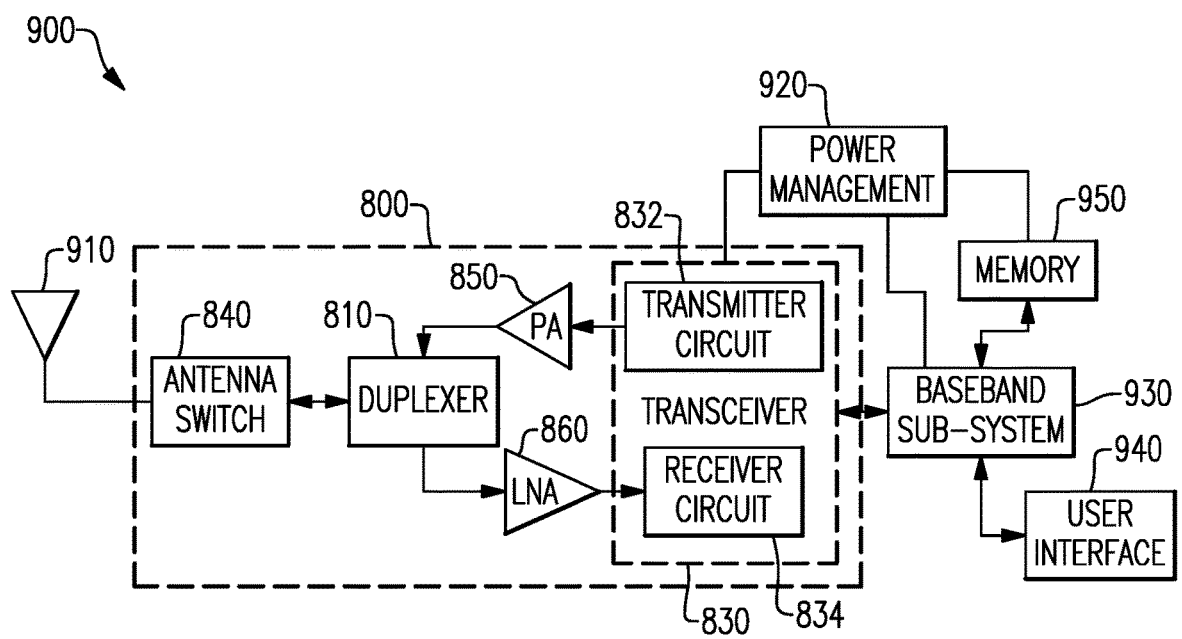
FIG. 14 is a block diagram of one example of a wireless device including the front-end module of FIG. 13.

The acoustic wave devices discussed herein can be implemented in a variety of packaged modules. Some example packaged modules will now be discussed in which any suitable principles and advantages of the packaged acoustic wave devices discussed herein can be implemented. FIGS. 12, 13, and 14 are schematic block diagrams of illustrative packaged modules and devices according to certain embodiments.

As discussed above, embodiments of the disclosed BAW resonators can be configured as or used in filters, for example. In turn, a BAW filter using one or more BAW resonator elements may be incorporated into and packaged as a module that may ultimately be used in an electronic device, such as a wireless communications device, for example. FIG. 12 is a block diagram illustrating one example of a module 700 including a BAW filter 710. The BAW filter 710 may be implemented on one or more die(s) 720 including one or more connection pads 722. For example, the BAW filter 710 may include a connection pad 722 that corresponds to an input contact for the BAW filter and another connection pad 722 that corresponds to an output contact for the BAW filter. The packaged module 700 includes a packaging substrate 730 that is configured to receive a plurality of components, including the die 720. A plurality of connection pads 732 can be disposed on the packaging substrate 730, and the various connection pads 722 of the BAW filter die 720 can be connected to the connection pads 732 on the packaging substrate 730 via electrical connectors 734, which can be solder bumps or wirebonds, for example, to allow for passing of various signals to and from the BAW filter 710. The module 700 may optionally further include other circuitry die 740, such as, for example one or more additional filter(s), amplifiers, pre-filters, modulators, demodulators, down converters, and the like, as would be known to one of skill in the art of semiconductor fabrication in view of the disclosure herein. In some embodiments, the module 700 can also include one or more packaging structures to, for example, provide protection and facilitate easier handling of the module 700. Such a packaging structure can include an overmold formed over the packaging substrate 730 and dimensioned to substantially encapsulate the various circuits and components thereon.

Various examples and embodiments of the BAW filter 710 can be used in a wide variety of electronic devices. For example, the BAW filter 710 can be used in an antenna duplexer, which itself can be incorporated into a variety of electronic devices, such as RF front-end modules and communication devices.

Referring to FIG. 13, there is illustrated a block diagram of one example of a front-end module 800, which may be used in an electronic device such as a wireless communications device (e.g., a mobile phone) for example. The front-end module 800 includes an antenna duplexer 810 having a common node 802, an input node 804, and an output node 806. An antenna 910 is connected to the common node 802.

The antenna duplexer 810 may include one or more transmission filters 812 connected between the input node 804 and the common node 802, and one or more reception filters 814 connected between the common node 802 and the output node 806. The passband(s) of the transmission filter(s) are different from the passband(s) of the reception filters. Examples of the BAW filter 710 can be used to form the transmission filter(s) 812 and/or the reception filter(s) 814. An inductor or other matching component 820 may be connected at the common node 802.

The front-end module 800 further includes a transmitter circuit 832 connected to the input node 804 of the duplexer 810 and a receiver circuit 834 connected to the output node 806 of the duplexer 810. The transmitter circuit 832 can generate signals for transmission via the antenna 910, and the receiver circuit 834 can receive and process signals received via the antenna 910. In some embodiments, the receiver and transmitter circuits are implemented as separate components, as shown in FIG. 13, however in other embodiments these components may be integrated into a common transceiver circuit or module. As will be appreciated by those skilled in the art, the front-end module 800 may include other components that are not illustrated in FIG. 13 including, but not limited to, switches, electromagnetic couplers, amplifiers, processors, and the like.

FIG. 14 is a block diagram of one example of a wireless device 900 including the antenna duplexer 810 shown in FIG. 13. The wireless device 900 can be a cellular phone, smart phone, tablet, modem, communication network or any other portable or non-portable device configured for voice or data communication. The wireless device 900 can receive and transmit signals from the antenna 910. The wireless device includes an embodiment of a front-end module 800 similar to that discussed above with reference to FIG. 13. The front-end module 800 includes the duplexer 810, as discussed above. In the example shown in FIG. 14 the front-end module 800 further includes an antenna switch 840, which can be configured to switch between different frequency bands or modes, such as transmit and receive modes, for example. In the example illustrated in FIG. 14, the antenna switch 840 is positioned between the duplexer 810 and the antenna 910; however, in other examples the duplexer 810 can be positioned between the antenna switch 840 and the antenna 910. In other examples the antenna switch 840 and the duplexer 810 can be integrated into a single component.

The front-end module 800 includes a transceiver 830 that is configured to generate signals for transmission or to process received signals. The transceiver 830 can include the transmitter circuit 832, which can be connected to the input node 804 of the duplexer 810, and the receiver circuit 834, which can be connected to the output node 806 of the duplexer 810, as shown in the example of FIG. 13.

Signals generated for transmission by the transmitter circuit 832 are received by a power amplifier (PA) module 850, which amplifies the generated signals from the transceiver 830. The power amplifier module 850 can include one or more power amplifiers. The power amplifier module 850 can be used to amplify a wide variety of RF or other frequency-band transmission signals. For example, the power amplifier module 850 can receive an enable signal that can be used to pulse the output of the power amplifier to aid in transmitting a wireless local area network (WLAN) signal or any other suitable pulsed signal. The power amplifier module 850 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 850 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 14, the front-end module 800 may further include a low noise amplifier module 860, which amplifies received signals from the antenna 910 and provides the amplified signals to the receiver circuit 834 of the transceiver 830.

The wireless device 900 of FIG. 14 further includes a power management sub-system 920 that is connected to the transceiver 830 and manages the power for the operation of the wireless device 900. The power management system 920 can also control the operation of a baseband sub-system 930 and various other components of the wireless device 900. The power management system 920 can include, or can be connected to, a battery (not shown) that supplies power for the various components of the wireless device 900. The power management system 920 can further include one or more processors or controllers that can control the transmission of signals, for example. In one embodiment, the baseband sub-system 930 is connected to a user interface 940 to facilitate various input and output of voice and/or data provided to and received from the user. The baseband sub-system 930 can also be connected to memory 950 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bulk acoustic wave resonator device comprising:
a piezoelectric material layer having an upper surface and a lower surface;
a first metal layer having a lower surface disposed on the upper surface of the piezoelectric material layer and an upper surface;
a second metal layer having an upper surface disposed on the lower surface of the piezoelectric material layer and a lower surface; and
a laterally distributed raised frame including a first raised frame disposed on the upper surface of the first metal layer and having an inner raised frame section with a tapered portion and a non-tapered portion and an outer raised frame section, and a second raised frame disposed beneath the first metal layer and the outer raised frame section, but not beneath the inner raised frame section, the inner raised frame section of the first raised frame being laterally disposed from a central active region of the bulk acoustic wave resonator device by a first distance, the outer raised frame section of the first raised frame being laterally disposed from the central active region of the bulk acoustic wave resonator device by a second distance, the second distance being greater than the first distance, the laterally distributed raised frame configured to improve reflection of lateral mode waves and to reduce conversion of main mode waves into lateral mode waves.

2. The bulk acoustic wave resonator device of claim 1 wherein the first raised frame is formed of a metal.

3. The bulk acoustic wave resonator device of claim 2 wherein the second raised frame is formed of an oxide.

4. The bulk acoustic wave resonator device of claim 1 wherein the outer raised frame section of the first raised frame has a width and a substantially uniform thickness across the width.

5. The bulk acoustic wave resonator device of claim 1 wherein the second raised frame includes an inner tapered portion and an outer non-tapered portion.

6. The bulk acoustic wave resonator device of claim 5 wherein the inner tapered portion of the second raised frame has a taper angle of from 10° and 60°.

7. The bulk acoustic wave resonator device of claim 5 wherein the outer non-tapered portion of the second raised frame has a width and a substantially uniform thickness across the width.

8. The bulk acoustic wave resonator device of claim 1 wherein the tapered portion of the inner raised frame section of the first raised frame has a taper angle of from 5° to 45°.

9. The bulk acoustic wave resonator device of claim 1 further comprising a dielectric layer disposed on the upper surface of the first metal layer and defining a recessed frame region surrounding the central active region.

10. The bulk acoustic wave resonator device of claim 1 wherein the bulk acoustic wave resonator device does not include a recessed frame region.

11. The bulk acoustic wave resonator device of claim 1 wherein the tapered portion of the inner raised frame section of the first raised frame has a width that is less than a width of the non-tapered portion of the inner raised frame section of the first raised frame.

12. The bulk acoustic wave resonator device of claim 1 wherein the tapered portion of the inner raised frame section of the first raised frame has a width that is greater than a width of the non-tapered portion of the inner raised frame section of the first raised frame.

13. The bulk acoustic wave resonator device of claim 1 wherein the second raised frame has an upper surface in contact with the lower surface of the first metal layer.

14. The bulk acoustic wave resonator device of claim 1 wherein the second raised frame has a lower surface in contact with the upper surface of the second metal layer.

15. The bulk acoustic wave resonator device of claim 14 wherein the second raised frame has an upper surface in contact with the piezoelectric material layer.

16. The bulk acoustic wave resonator device of claim 1 wherein the second raised frame has an upper surface in contact with the piezoelectric material layer.

17. The bulk acoustic wave resonator device of claim 16 wherein the second raised frame has a lower surface in contact with the piezoelectric material layer, the second raised frame dividing the piezoelectric material layer into an upper piezoelectric material layer and a lower piezoelectric material layer.

18. The bulk acoustic wave resonator device of claim 1 wherein the first raised frame is formed of a material with a higher acoustic impedance than a material of which the second raised frame is formed and a higher acoustic impedance than a material of which the piezoelectric material layer is formed.

19. The bulk acoustic wave resonator device of claim 1 wherein the second raised frame is formed of a material with a lower acoustic impedance than a material of which the first raised frame is formed and a lower acoustic impedance than a material of which the piezoelectric material layer is formed.

20. The bulk acoustic wave resonator device of claim 1 wherein the bulk acoustic wave resonator device is a film bulk acoustic wave resonator device including a cavity defined below the second metal layer.

21. The bulk acoustic wave resonator device of claim 1 wherein the bulk acoustic wave resonator device is a solidly mounted resonator including a Bragg reflector disposed beneath the second metal layer.

22. The bulk acoustic wave resonator device of claim 1 wherein the tapered portion of the inner raised frame section of the first raised frame has a linear taper.

23. The bulk acoustic wave resonator device of claim 1 wherein the tapered portion of the inner raised frame section of the first raised frame has a concave taper.

24. The bulk acoustic wave resonator device of claim 1 wherein the tapered portion of the inner raised frame section of the first raised frame has a convex taper.

25. The bulk acoustic wave resonator device of claim 1 wherein the second raised frame includes an inner tapered portion having a linear taper.

26. The bulk acoustic wave resonator device of claim 1 wherein the second raised frame includes an inner tapered portion having a concave taper.

27. The bulk acoustic wave resonator device of claim 1 wherein the second raised frame includes an inner tapered portion having a convex taper.

28. A radio frequency filter including the bulk acoustic wave resonator device of claim 1.

29. A radio frequency module including the radio frequency filter of claim 28.

30. A radio frequency device including the radio frequency module of claim 29.

* * * * *